(12) United States Patent
Kubik et al.

(10) Patent No.: US 10,101,414 B2
(45) Date of Patent: Oct. 16, 2018

(54) THIN FILM RESISTIVE DEVICE FOR USE IN AN INTEGRATED CIRCUIT, AN INTEGRATED CIRCUIT INCLUDING A THIN FILM RESISTIVE DEVICE

(71) Applicant: Analog Devices Global, Hamilton (BM)

(72) Inventors: Jan Kubik, Raheen (IE); Seamus P. Whiston, Raheen (IE); Padraig Michael Doran, Co. Wexford (IE)

(73) Assignee: Analog Devices Global, Hamilton (BM)

( * ) Notice: Subject to any disclaimer, the term of this patent is extended or adjusted under 35 U.S.C. 154(b) by 268 days.

(21) Appl. No.: 15/000,006

(22) Filed: Jan. 18, 2016

(65) Prior Publication Data
US 2017/0131368 A1 May 11, 2017

(30) Foreign Application Priority Data
Nov. 11, 2015 (GB) ................................ 1519905.2

(51) Int. Cl.
*G01R 33/02* (2006.01)
*G01R 33/09* (2006.01)

(52) U.S. Cl.
CPC .......... *G01R 33/09* (2013.01); *G01R 33/096* (2013.01)

(58) Field of Classification Search
CPC ......... G01R 33/93; G01R 33/09; B82Y 25/00
USPC ....................... 324/252, 249, 760.02, 760.01
See application file for complete search history.

(56) References Cited

U.S. PATENT DOCUMENTS

| | | | |
|---|---|---|---|
| 5,901,018 A | * | 5/1999 | Fontana, Jr. .......... G11B 5/332 360/324.2 |
| 6,011,390 A | | 1/2000 | Loreit et al. |
| 7,282,755 B2 | | 10/2007 | Pakala et al. |
| 8,283,921 B2 | | 10/2012 | Huber et al. |
| 8,395,381 B2 | | 3/2013 | Lo et al. |
| 2003/0047728 A1 | * | 3/2003 | Chen ...................... B82Y 10/00 257/10 |
| 2004/0051763 A1 | * | 3/2004 | Matsubara .......... B41J 2/14233 347/68 |
| 2006/0209473 A1 | * | 9/2006 | Oshima .................. B82Y 25/00 360/324.12 |

(Continued)

OTHER PUBLICATIONS

Sensitec, AA745A MagnetoResistive FreePitch Sensor Data Sheet, Jul. 22, 2015, 8 pages, available at: http://sensitec.com/upload/SENSITEC/PDF_Downloads/Datenblatt/SENSITEC_AA745A_DSE_04.pdf (accessed: Jan. 19, 2016).

(Continued)

*Primary Examiner* — Tung X Nguyen
*Assistant Examiner* — Dominic Hawkins
(74) *Attorney, Agent, or Firm* — Knobbe, Martens, Olson & Bear LLP

(57) ABSTRACT

Thin film resistive sensors typically include a number of resistive components. These components should be well matched in order for the sensor to provide accurate readings. When a sensor is incorporated within an integrated circuit, the resistive components may be formed over, or under, metallic traces that form part of other components. As a result, the thin film resistive components are subjected to different levels of stress. This disclosure provides a structure that is arranged to mitigate the effects of stress.

20 Claims, 23 Drawing Sheets

(56) References Cited

U.S. PATENT DOCUMENTS

| | | | | |
|---|---|---|---|---|
| 2006/0228879 A1* | 10/2006 | Beach | ................... | H01C 7/006 |
| | | | | 438/622 |
| 2007/0183101 A1* | 8/2007 | Yoon | ................... | B82Y 25/00 |
| | | | | 360/324.2 |
| 2008/0218163 A1* | 9/2008 | Hosomi | ................ | B82Y 25/00 |
| | | | | 324/252 |
| 2009/0295869 A1* | 12/2009 | Martina | ................ | B41J 2/1433 |
| | | | | 347/47 |
| 2013/0093056 A1* | 4/2013 | Kim | ................... | H01L 23/5228 |
| | | | | 257/536 |
| 2013/0141091 A1 | 6/2013 | Delaet et al. | | |
| 2014/0118017 A1* | 5/2014 | Otabe | ................... | H05K 1/167 |
| | | | | 324/756.03 |
| 2016/0276578 A1* | 9/2016 | Kobayashi | ............. | H01L 43/08 |

OTHER PUBLICATIONS

Infineon, Angle Sensor GMR-Based Angular Sensor TLE5009 Data Sheet, Rev. 1.1, Apr. 2014, 32 pages, available at: http://www.infineon.com/dgdl/Infineon-TLE5009_FDS-DS-v01_01-en.pdf?fileId=db3a304330f686060131421d8ddd56b0 (accessed: accessed: Jan. 19, 2016).

Infineon, TLE5012 GMR-Based Angular Sensor for Rotor Position Sensing Data Sheet, V 0.46, Sep. 2009, 57 pages, available at: http://www.symmetron.ua/files/TLE5012_TDS_V_0.46.pdf (accessed: accessed: Jan. 19, 2016).

\* cited by examiner

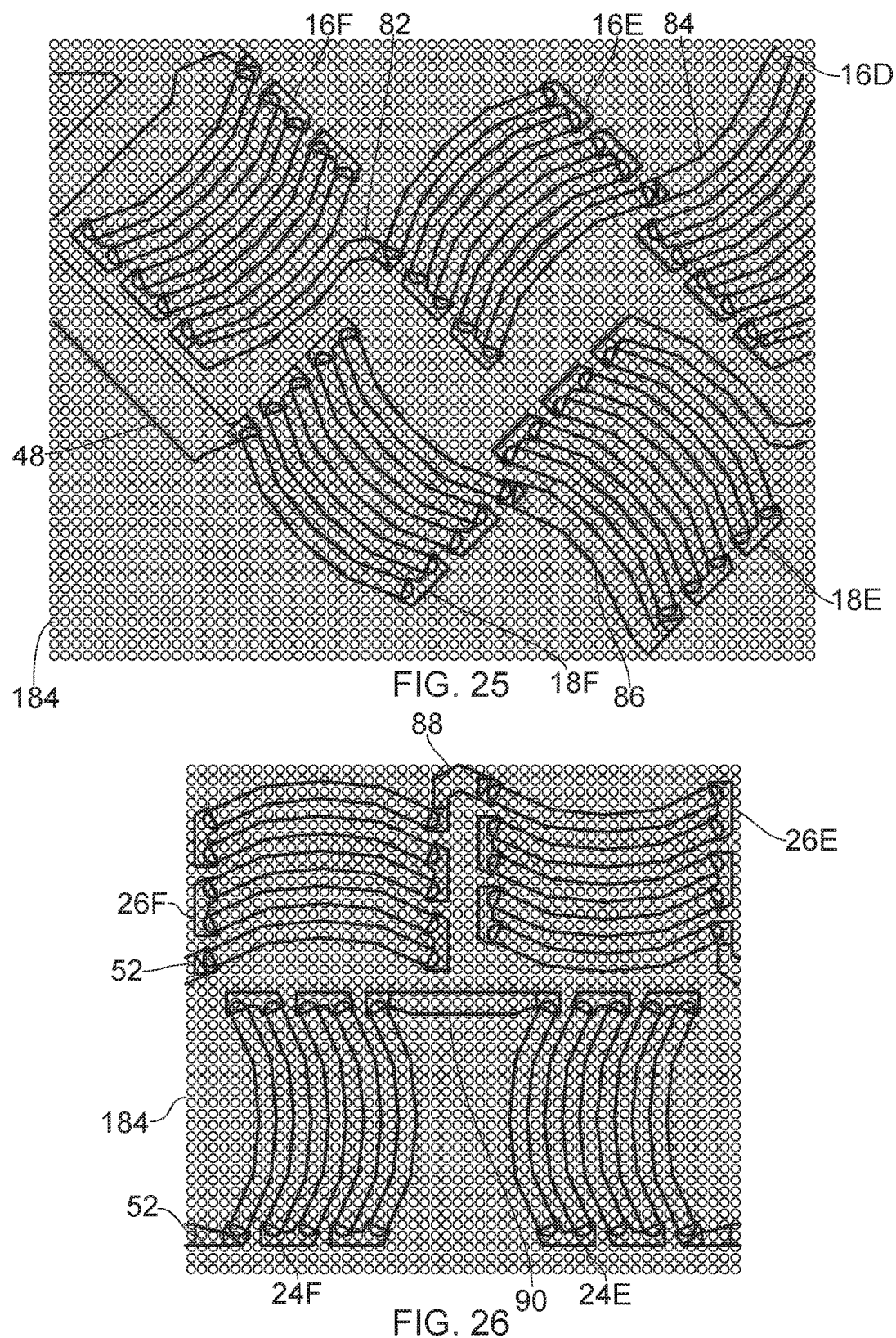

THIN FILM RESISTIVE DEVICE FOR USE IN AN INTEGRATED CIRCUIT, AN INTEGRATED CIRCUIT INCLUDING A THIN FILM RESISTIVE DEVICE

CROSS-REFERENCE TO RELATED APPLICATION

Any and all applications for which a foreign or domestic priority claim is identified in the Application Data Sheet as filed with the present application are hereby incorporated by reference under 37 CFR 1.57. This application claims the benefit of priority of United Kingdom Patent Application No. GB 1519905.2, filed on Nov. 11, 2015, the entire disclosure of which is hereby incorporated by reference herein.

BACKGROUND

Technical Field

The present disclosure relates to an improved thin film resistive device fabricated using microelectronic techniques, and to integrated circuits including such a device.

Description of Related Technology

Thin film resistive sensors are used for a variety of applications. For example, magnetoresistive sensors may be used in order to determine an angular relationship between two parts of a system. Such sensors typically include a number of resistive components. Having these resistive components well matched can assist in producing accurate readings. When thin film resistive devices are incorporated on a single die with other components, those other components can produce uneven stress levels in the thin film components. This can degrade the matching of the thin film resistors. Furthermore, temperature changes in the sensor may affect parameters such as offset drift. This can also have an impact on the accuracy of the device and can make calibration procedures expensive.

It would be beneficial to provide a thin film resistive device in which component matching is improved, and which is more resilient to temperature changes.

SUMMARY OF CERTAIN INVENTIVE ASPECTS

Thin film resistive sensors typically include a number of resistive components. These components should be well matched in order for the sensor to provide accurate readings. When a sensor is incorporated within an integrated circuit, the resistive components may be formed over, or under, metallic traces that form part of other components. As a result, the thin film resistive components are subjected to different levels of stress. This disclosure provides a structure that is arranged to mitigate the effects of stress.

According to a first aspect of the present disclosure there is provided a thin film resistive device for use in an integrated circuit, comprising: a plurality of thin film resistive elements formed in a first layer of the device so as to form a first circuit, and a stress equalization structure comprising a plurality of stress equalization elements formed in a second layer of the device, the elements arranged so as to equalize the stress imposed on the resistive components from other components of the integrated circuit.

BRIEF DESCRIPTION OF THE DRAWINGS

Embodiments of this disclosure will now be described, by way of non-limiting example only, with reference to the accompanying drawings, in which:

FIG. 25 is close-up plan view of a section of the circuit of FIG. 24;

FIG. 26 is a close-up plan view of another section of the circuit of FIG. 24;

DETAILED DESCRIPTION OF CERTAIN EMBODIMENTS

Figure 1:
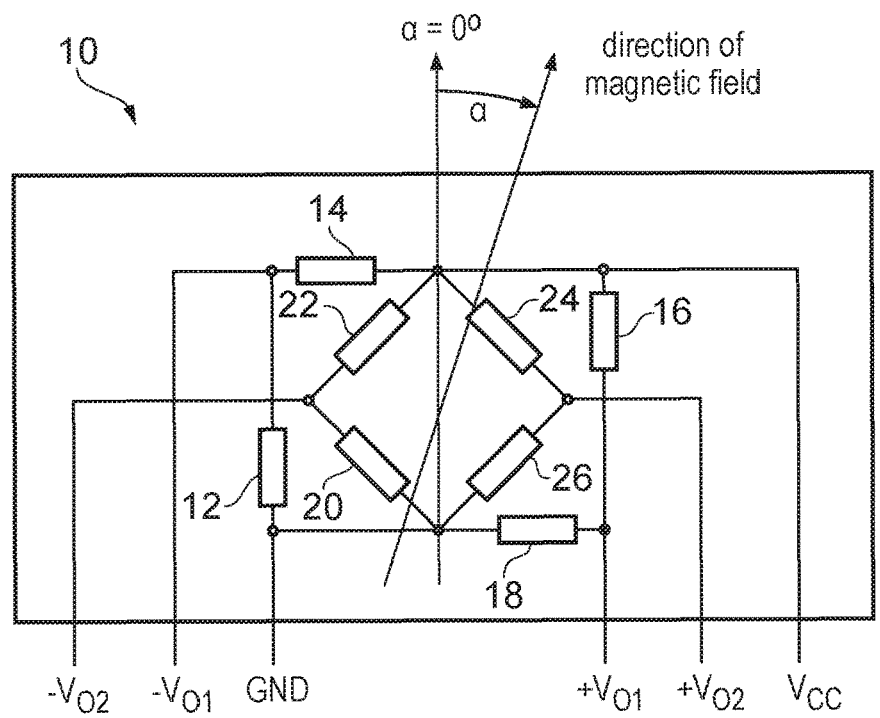
FIG. 1 is a circuit diagram showing a thin film magnetoresistive sensor.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The present disclosure provides a thin film resistive device, which may be a magnetoresistive sensor, and which includes a stress equalization layer to mitigate the effects of underlying (or overlaying) metal in the integrated circuit. The thin film devices discussed herein can be used in a variety of magnetoresistive sensors, such as anisotropic magnetoresistive (AMR) sensors, giant magnetoresistive (GMR) sensors, or tunneling magnetoresistive (TMR) sensors. Typically the thin film resistive device is formed over other components. Those other components can include metallic traces that once integrated can exert stress on the resistive elements of the thin film device. This stress can change the characteristic impedance of the resistive elements. In a sensor including a bridge circuit, this can result in the resistors not being matched. The stress equalization layer includes a periodic pattern of metallic conductors that underlie the device. This can cause the resistive elements of the device to "see" the same underlying metal, negating the impact of other metal traces found beneath the device.

FIG. 1 shows a circuit diagram of a magnetoresistive thin film (TF) sensor 10. The sensor 10 of FIG. 1 is an AMR sensor. The sensor 10 includes two Wheatstone bridges that are connected in parallel. A first Wheatstone bridge comprises magnetoresistive TF resistors 12, 14, 16 and 18. A second Wheatstone bridge comprises magnetoresistive TF resistors 20, 22, 24 and 26. The resistors of each bridge are connected in a conventional bridge configuration. Both bridges share a connection to ground (GND) and a connection to a positive voltage ($V_{cc}$). There are four output lines in the sensor 10. These output lines are labeled $+V_{O1}$, $+V_{O2}$, $-V_{O1}$ and $-V_{O2}$ for the corresponding voltages associated with these output lines. The first Wheatstone bridge is coupled to output lines $+V_{O1}$, and $-V_{O1}$. The second Wheatstone bridge is coupled to output lines $+V_{O2}$ and $-V_{O2}$.

As these bridges are being used as sensors, their relative orientation is significant. Accordingly, in the first Wheatstone bridge, resistors 12 and 16 are parallel to each other, but orthogonal to resistors 14 and 18. Similarly, in the second Wheatstone bridge, resistors 20 and 26 are parallel to each other, but orthogonal to resistors 22 and 24. Furthermore, the first Wheatstone bridge is oriented at 45° to the second Wheatstone bridge. Accordingly, resistor 14 is at 45° to resistor 22, resistor 16 is at 45° to resistor 24, resistor 18 is at 45° to resistor 26, and resistor 12 is at 45° to resistor 20. In FIG. 1, a is the direction of a magnetic field applied to the sensor 10.

Figure 2:
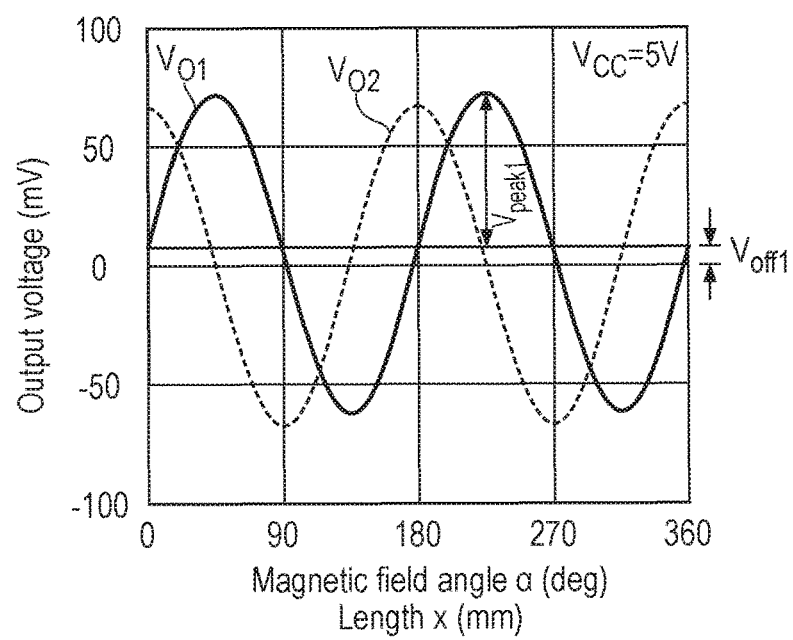
FIG. 2 is a chart showing the output of the sensor of FIG. 1.

FIG. 2 is chart showing the output of the sensor 10 with respect to a varying magnetic field. The chart shows the magnetic field angle α (degrees) on the x-axis, and the output voltage (mV) on the y-axis. The chart plots output voltages $V_{O1}$ and $V_{O2}$, in which:

$$V_{O1} = +V_{O1} - -V_{O1}$$

$$V_{O2} = +V_{O2} - -V_{O2}$$

As can be seen from FIG. 2, $V_{O1}$ and $V_{O2}$ both vary sinusoidally with respect to varying magnetic field angle.

Figure 3:
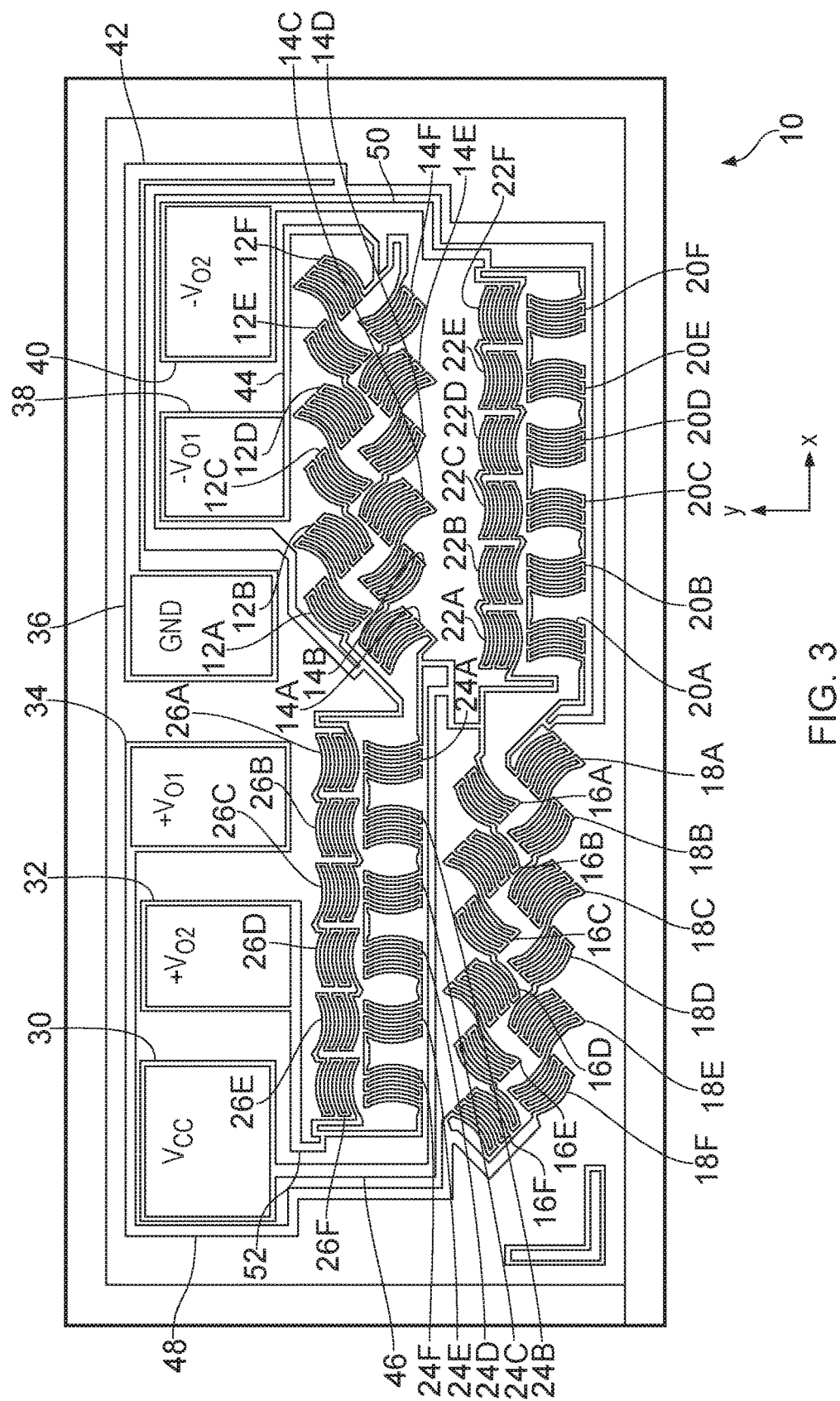
FIG. 3 is a plan view of an integrated circuit incorporating the sensor of FIG. 1 in accordance with an embodiment of the disclosure.

FIG. 3 shows a physical layout of magnetoresistive TF sensor 10 in accordance with an embodiment of the disclosure. In this embodiment, the stress equalization layer is removed so that the other components of the sensor may be clearly shown and described. Each resistor in the sensor 10 is formed from a plurality groups of magnetoresistive thin film resistive elements. In certain embodiments, the thin film resistive elements can have a thickness selected in the range from about 20 Å to 5,000 Å. In the example of FIG. 3, each resistor includes six groups of TF elements, and each group includes five resistive thin film elements. The illustrated resistive elements are arcuate and formed in parallel to the other elements of the same group. The illustrated resistive elements are the same length and are interconnected by thin film interconnectors at alternating ends, so as to connect the elements in a series circuit. The sensor 10 also includes six bondpads. Bondpad 30 is for connection to $V_{CC}$. Bondpad 32 is for connection to output line $+V_{O2}$. Bondpad 34 is for connection to output line $+V_{O1}$. Bondpad 36 is for connection to GND. Bondpad 38 is for connection to output line $-V_{O1}$. Bondpad 32 is for connection to output line $-V_{O2}$.

Resistor 12 includes groups of elements 12A to 12F. Each group is connected to the next group by a thin film interconnector. Group 12A is coupled to GND via interconnector 42. Group 12F is coupled to $-V_{O1}$ by interconnector 44. Groups 12A to 12F are oriented such that the relative orientation of the groups of elements is 45° to the x-axis. The arcs of the elements of groups 12B, 12D and 12F are oriented at 180° to the arcs of the elements of groups 12A, 12C and 12E. Each group of elements is offset from an adjacent group such that lines intersecting the midpoints of the elements of each group are spaced apart by a distance approximately equal to the length of one element.

Resistor 14 includes groups of elements 14A to 14F. Each group is connected to the next group by a thin film interconnector. Group 14A is coupled to $V_{CC}$ via interconnector 46. Group 14F is coupled to $-V_{O1}$ by interconnector 44. Groups 14A to 14F are oriented such that the relative orientation of the groups of elements is 45° to the x-axis. The arcs of the elements of groups 14B, 14D and 14F are oriented at 180° to the arcs of the elements of groups 14A, 14C and 14E. Each group of elements is offset from an adjacent group such that lines intersecting the midpoints of the elements of each group are spaced apart by a distance approximately equal to the length of one element. Furthermore, groups 14A to 14F are oriented at 90° to the respective groups 12A to 12F, thus achieving the relative orientation between resistors 12 and 14 shown in FIG. 1. In addition, resistors 12 and 14 are coupled together by interconnector 44.

Resistor 16 includes groups of elements 16A to 16F. Each group is connected to the next group by a thin film interconnector. Group 16A is coupled to $V_{cc}$ via interconnector 46. Group 16F is coupled to $+V_{O1}$ by interconnector 48. Groups 16A to 16F are oriented such that the relative orientation of the groups of elements is 45° to the x-axis. The arcs of the elements of groups 16B, 16D and 16F are oriented at 180° to the arcs of the elements of groups 16A, 16C and 16E. Each group of elements is offset from an adjacent group such that lines intersecting the midpoints of the elements of each group are spaced apart by a distance approximately equal to the length of one element. Furthermore, groups 16A to 16F have the same orientation as respective ones of groups 12A to 12F, thus achieving the same relative orientation between resistors 12 and 16 shown in FIG. 1.

Resistor 18 includes groups of elements 18A to 18F. Each group is connected to the next group by a thin film interconnector. Group 18A is coupled to GND via interconnector 42. Group 18F is coupled to $+V_{O1}$ by interconnector 48. Groups 18A to 18F are oriented such that the relative orientation of the groups of elements is 45° to the x-axis. The arcs of the elements of groups 18B, 18D and 18F are oriented at 180° to the arcs of the elements of groups 18A, 18C and 18E. Each group of elements is offset from an adjacent group such that lines intersecting the midpoints of the elements of each group are spaced apart by a distance approximately equal to the length of one element. Furthermore, groups 18A to 18F are oriented at 90° to the respective groups 16A to 16F, thus achieving the relative orientation between resistors 16 and 18 shown in FIG. 1. In addition, resistors 16 and 18 are coupled together by interconnector 48. Accordingly, resistors 12, 14, 16 and 18 are coupled together and orientated so as to form a first Wheatstone bridge.

Resistor 20 includes groups of elements 20A to 20F. Each group is connected to the next group by a thin film interconnector. Group 20A is coupled to GND via interconnector 42. Group 20F is coupled to $-V_{O2}$ by interconnector 50. Groups 20A to 20F are oriented such that the relative orientation of the groups of elements is 90° to the x-axis. The arcs of the elements of groups 20B, 20D and 20F are oriented at 180° to the arcs of the elements of groups 20A, 20C and 20E. Each group of elements is aligned with an adjacent group such that lines intersecting the midpoints of the elements of each group are aligned.

Resistor 22 includes groups of elements 22A to 22F. Each group is connected to the next group by a thin film interconnector. Group 22A is coupled to $V_{CC}$ via interconnector 46. Group 22F is coupled to $-V_{O2}$ by interconnector 50. Groups 22A to 22F are oriented such that the groups of elements are parallel to the x-axis. The arcs of the elements of groups 22B, 22D and 22F are oriented at 180° to the arcs of the elements of groups 22A, 22C and 22E. Each group of elements is offset from an adjacent group such that lines intersecting the midpoints of the elements of each group are spaced apart by a distance greater than the length of one element. Furthermore, groups 22A to 22F are oriented at 90° to the respective groups 20A to 20F, thus achieving the relative orientation between resistors 20 and 22 shown in FIG. 1. In addition, resistors 20 and 22 are coupled together by interconnector 50.

Resistor 24 includes groups of elements 24A to 24F. Each group is connected to the next group by a thin film interconnector. Group 24A is coupled to $V_{CC}$ via interconnector 46. Group 24F is coupled to $+V_{O2}$ by interconnector 52. Groups 24A to 24F are oriented such that the relative orientation of the groups of elements is 90° to the x-axis. The arcs of the elements of groups 24B, 24D and 24F are oriented at 180° to the arcs of the elements of groups 24A, 24C and 24E. Each group of elements is aligned with an adjacent group such that lines intersecting the midpoints of the elements of each group are aligned. Furthermore, groups 24A to 24F have the same orientation as respective ones of groups 20A to 20F, thus achieving the same relative orientation between resistors 20 and 24 shown in FIG. 1.

Resistor 26 includes groups of elements 26A to 26F. Each group is connected to the next group by a thin film interconnector. Group 26A is coupled to GND via interconnector 42. Group 26F is coupled to $+V_{O2}$ by interconnector 52. Groups 26A to 26F are parallel to the x-axis. The arcs of the elements of groups 26B, 26D and 26F are oriented at 180° to the arcs of the elements of groups 26A, 26C and 26E. Each group of elements is offset from an adjacent group such that lines intersecting the midpoints of the elements of each group are spaced apart by a distance greater than the length of one element. Furthermore, groups 26A to 26F are oriented at 90° to the respective groups 24A to 24F, thus achieving the relative orientation between resistors 24 and 26 shown in FIG. 1. In addition, resistors 24 and 26 are coupled together by interconnector 52. Accordingly, resistors 20, 22, 24 and 26 are coupled together and orientated so as to form a first Wheatstone bridge. Furthermore, resistors 20 to 26 are oriented at 45° to resistors 12 to 18 in the same manner as shown in FIG. 1.

It can be desirable for the resistors and their respective resistive elements to be well matched. Underlying and overpassing metal tracks placed in the same die can have an influence on the amount of stress the thin film elements are exposed to. Accordingly, if resistor 12 is deposited over a metal trace, and if resistor 14 is deposited over a plain inter-metal dielectric, these elements may not be as well matched as desired.

Figure 4:
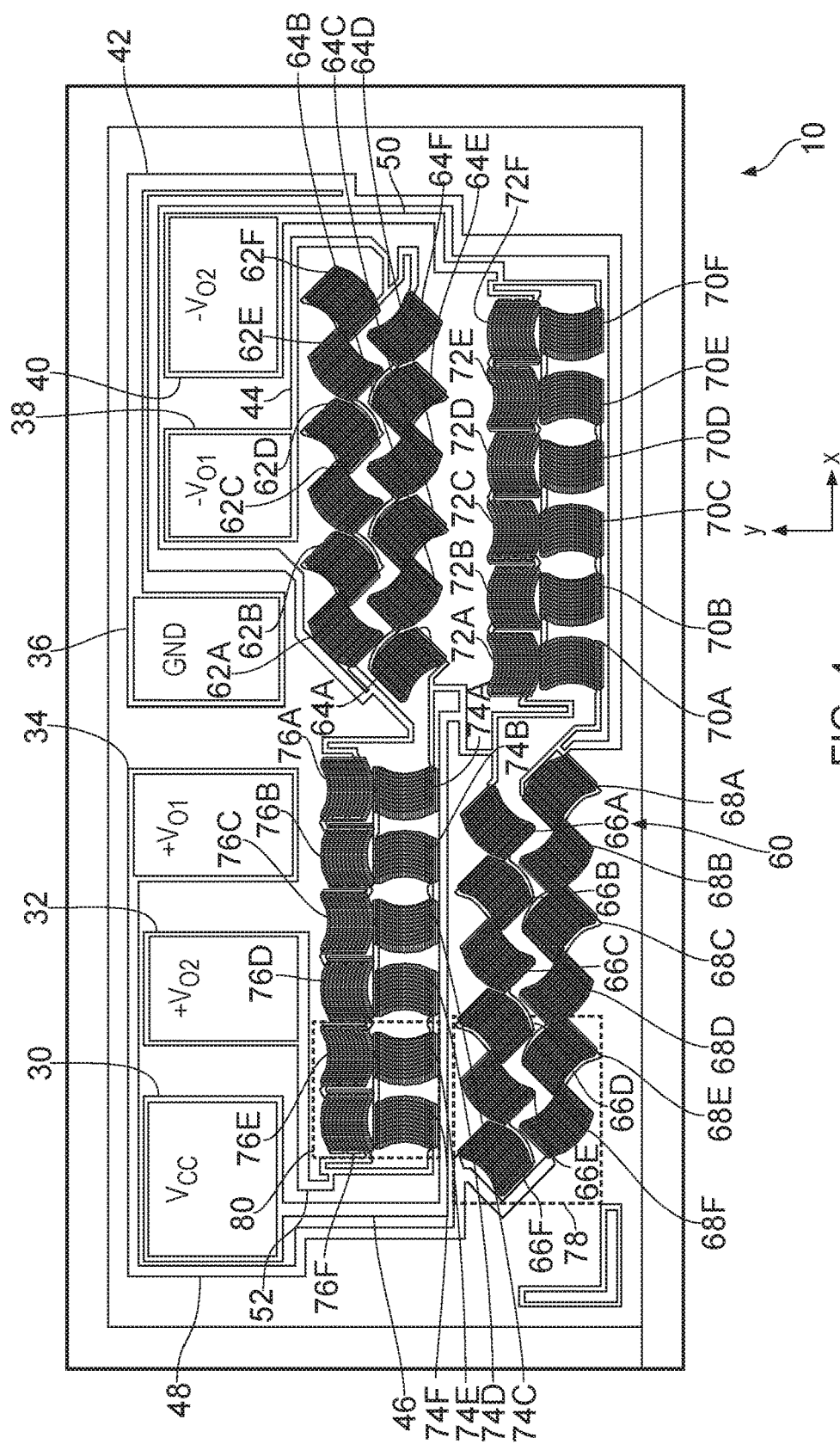
FIG. 4 is a plan view of an integrated circuit incorporating a thin film magnetoresistive sensor in accordance with an embodiment of the disclosure.

FIG. 4 shows a magnetoresistive TF sensor 10 in accordance with an embodiment of this disclosure. In this embodiment, the sensor 10 includes a stress equalization layer 60. This is shown by the generally darkened areas corresponding in position to the groups of TF elements. The stress equalization layer 60 comprises a metallic layer formed below the TF elements in the die. An isolation layer is formed between the TF elements and the metallic layer. In this example, the metallic layer is formed as series of linear metallic conductors. The conductors are arranged into groups, with each group corresponding to a group of TF elements. The stress equalization layer 60 includes metallic conductor groups 62A to 62F, 64A to 64F, 66A to 66F, 68A to 68F, 70A to 70F, 72A to 72F, 74A to 74F and 76A to 76F.

The shape formed by a group of conductors is substantially the same as the shape formed by each group of TF elements. However, as will be seen below, the conductor groups can cover an area slightly larger than the corresponding group of TF elements. Furthermore, some of the groups of conductors can overlap, and share the same linear metallic conductors, for example, as will be described below. In FIG. 4, two areas 78 and 80 are outlined by broken lines. These areas are shown in more detail in FIGS. 5 and 6 respectively.

Figure 5:
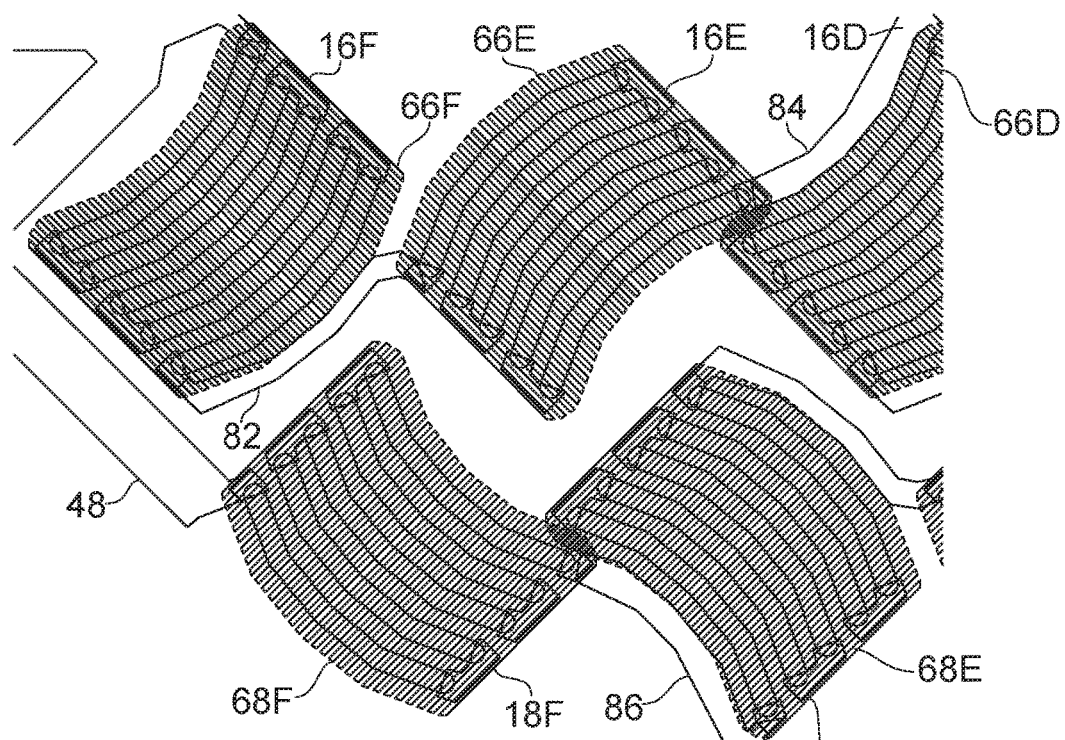
FIG. 5 is close-up plan view of a section of the circuit of FIG. 4.

FIG. 5 shows a close-up of the area 78 from FIG. 4. FIG. 5 shows groups of TF elements 16F, 16E, 16D, 18F and 18E. These groups are connected to bondpad 34 via TF interconnector 48. The groups are coupled together via TF interconnectors 82, 84 and 86. Each group of TF elements has a corresponding group of metallic conductors in the stress equalization layer. In this example, groups of metallic conductors 66F, 66E, 66D, 68F and 68E are shown. Further details of the metallic conductors will be described below. In this example, groups 66F and 66E are separate. However, owing to the proximity of the groups of elements 18F and 18E, groups of conductors 68F and 68E share seven linear metallic elements.

Figure 6:
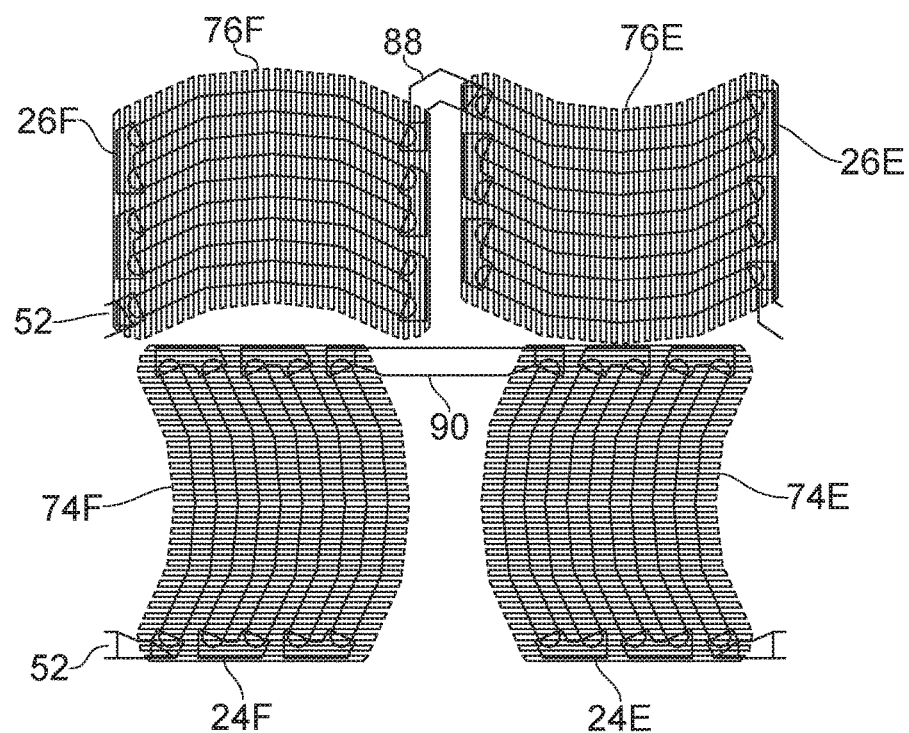
FIG. 6 is a close-up plan view of another section of the circuit of FIG. 4.

FIG. 6 shows a close-up of the area 80 from FIG. 4. FIG. 6 shows groups of TF elements 26F, 26E, 24F and 24E. These groups of elements are connected to bondpad 32 via interconnector 52. The groups are coupled together via interconnectors 88 and 90. Each group of elements has a corresponding group of metallic conductors in the stress equalization layer. In this example, four complete groups of metallic conductors 76F, 76E, 74F and 74E are shown. In this example, groups 76F, 76E, 74F and 74E are separate.

Figure 7:
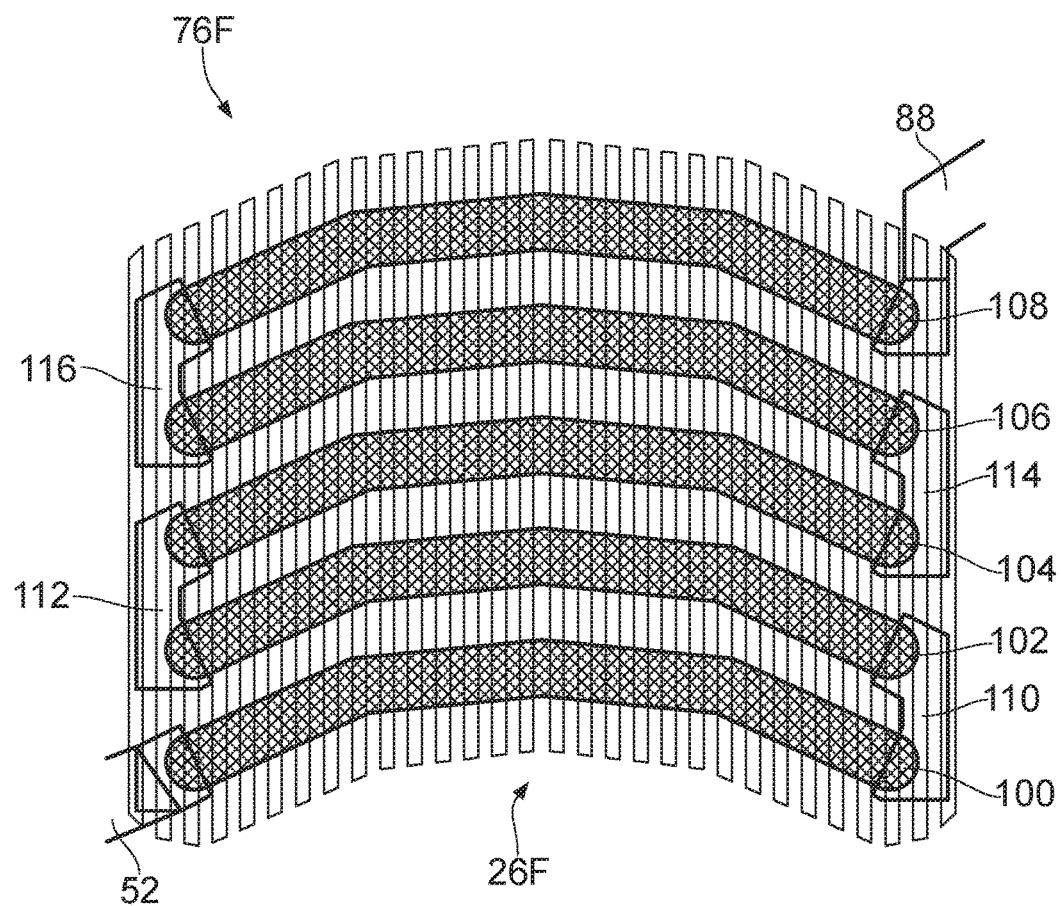
FIG. 7 is a close-up plan view of a group of thin film resistive elements of the circuit of FIG. 4.

FIG. 7 shows the detail of the group of TF elements 26F shown in FIG. 6. The group includes five magnetoresistive elements 100, 102, 104, 106 and 108. Each element is generally arcuate in shape, although in fact each illustrated element comprises a number of short linear sections. In this example, each element includes four linear sections. The elements can be approximately 60 μm long and 4 μm wide, for example. The elements are arranged adjacent to each other and in parallel. A gap measuring approximately 4 μm can be formed between elements. A first end of element 100 is connected to a thin film interconnector 52. As shown in FIG. 4, this interconnector couples element group 26F to bondpad 32. A second end of element 100 is connected to thin film interconnector 110, which is connected to a second end of element 102. A first end of element 102 is connected to thin film interconnector 112, which is connected to a first end of element 104. A second end of element 104 is connected to thin film interconnector 114, which is connected to a second end of element 106. A first end of element 106 is connected to thin film interconnector 116, which is connected to a first end of element 108. A second end of element 108 is connected to thin film interconnector 88. As shown in FIG. 4, this interconnector couples group 26F to group 26E. The above described arrangement results in a meandering resistive element pathway. The group of resistive elements together for a shape that approximates to a rectangle having two opposing arcuate edges, and two opposing straight edges.

FIG. 7 also shows part of the stress equalization layer 60. In particular, FIG. 7 shows the group of conductors 76F. Group 76F comprises a plurality of linear metallic conductors. In this example, there are thirty conductors. Given the relatively large number of conductors, they have not been individually numbered. The conductors can each be around 45 μm long, and 1 μm wide. They are arranged in parallel, and can be approximately 1 μm apart. They are orientated in a direction perpendicular to an imaginary line drawn between the first and second ends of the resistive elements. As such, the angle at which the metallic conductors intersect the resistive elements varies, depending upon where the intersection occurs. In FIG. 7, each of the metallic lines extends beyond the edges of outer elements 100 and 108 by a distance similar to the width of the elements. In a similar manner, at either end of the elements, the metallic conductors can extend beyond the ends of the elements, by a distance of around 4 μm, for example. The metallic conductors therefore define a stress equalization area that is similar in shape to the area defined by the elements. However, the stress equalization area in FIG. 7 is larger as it extends beyond the elements as described above. Furthermore, the metallic elements can all have a lesser width than the TF elements. In one example, the metallic elements may be between one firth and one tenth the width of the resistive elements. The spacing between the metallic elements may be similar to their widths. In one example, for TF elements that are 4 μm wide, the metallic elements may have widths of 0.4 μm and separation of 0.4 μm.

As a result of this arrangement, each resistive element can see almost the same amount of underlying metal as the other resistive elements. As such, and stress caused by other underlying metal traces can be substantially, if not completely equalized across the resistive elements.

Figure 8:
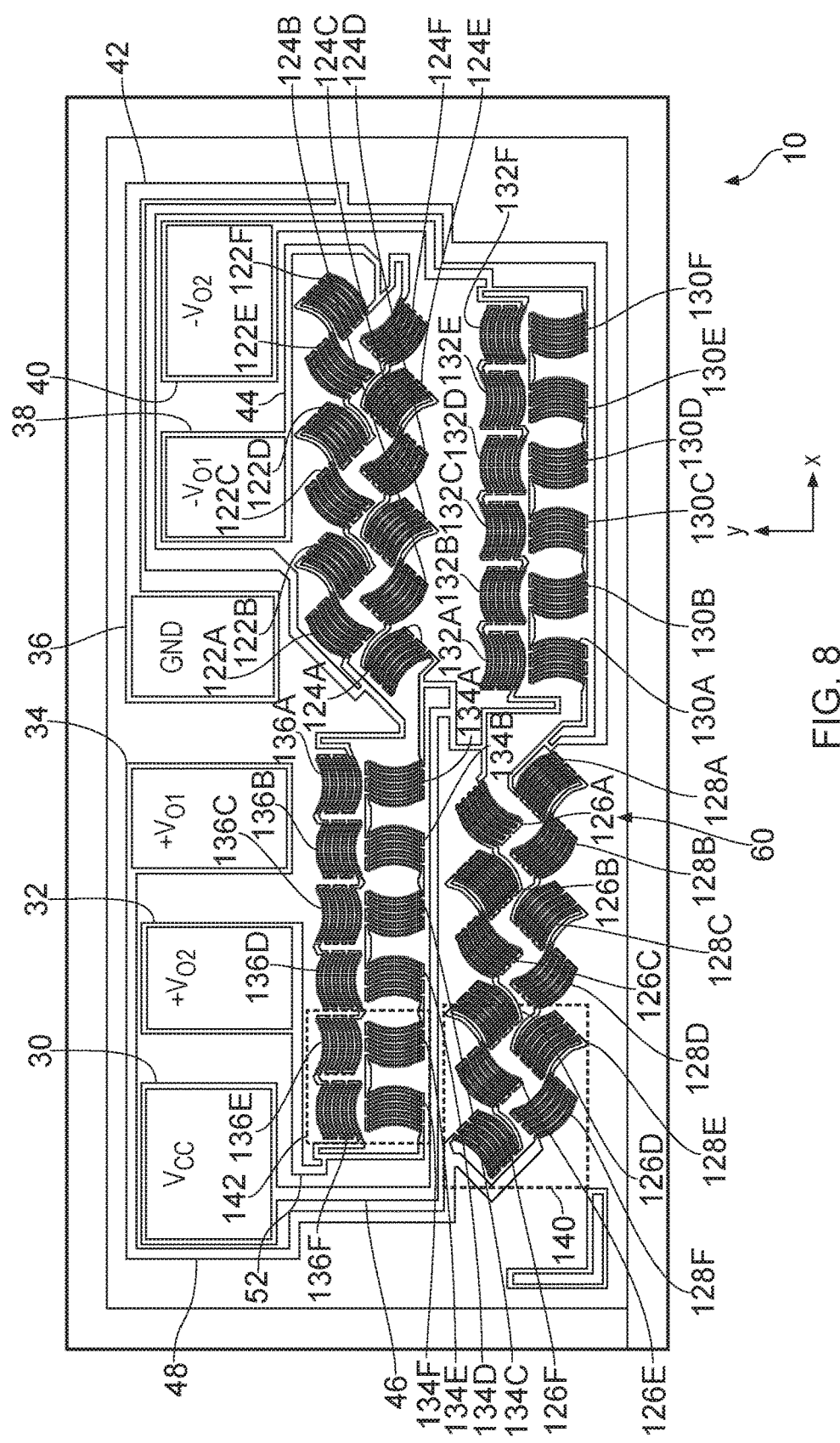
FIG. 8 is a plan view of an integrated circuit incorporating a thin film magnetoresistive sensor in accordance with a further embodiment of the disclosure.

FIG. 8 shows magnetoresistive TF sensor 10 in a further embodiment of this disclosure. In this embodiment, sensor 10 includes the same components as the previous embodiments. However, the stress equalization layer 60 takes a different form. In this embodiment, the metallic layer is formed as series of linear metallic conductors. However, the conductors do not run continuously under the elements of each group of elements. Instead, they only extend under each element, as will be described below. The conductors are arranged into groups, with each group corresponding to a group of TF elements. The stress equalization layer 60 includes metallic conductor groups 122A to 122F, 124A to 124F, 126A to 126F, 128A to 128F, 130A to 130F, 132A to 132F, 134A to 134F and 136A to 136F. In FIG. 8, two areas 140 and 142 are outlined by broken lines. These areas are shown in more detail in FIGS. 9 and 10 respectively.

Figure 9:
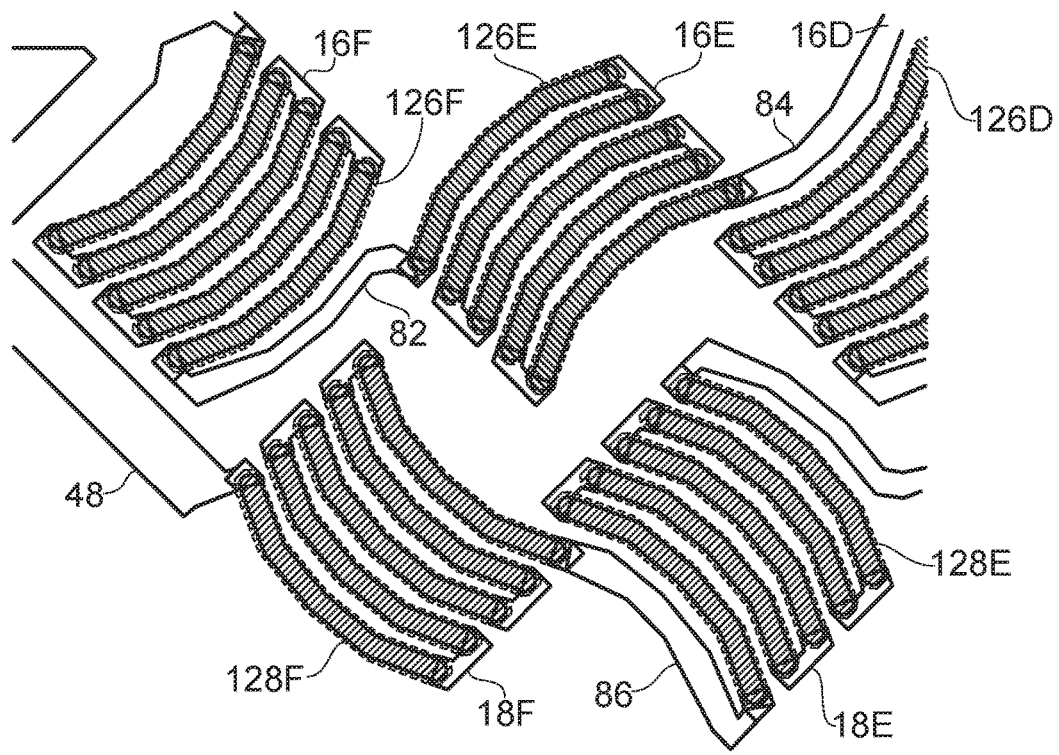
FIG. 9 is close-up plan view of a section of the circuit of FIG. 8.

FIG. 9 shows a close-up of the area 140 from FIG. 8. FIG. 9 shows groups of elements 16F, 16E, 16D, 18F and 18E. These groups are connected to bondpad 34 via TF interconnector 48. The groups are coupled together via TF interconnectors 82, 84 and 86. Each group of elements has a corresponding group of metallic conductors in the stress equalization layer 60. In this example, groups of metallic conductors 126F, 126E, 126D, 128F and 126E are shown. Further details of the metallic conductors will be described below.

Figure 10:
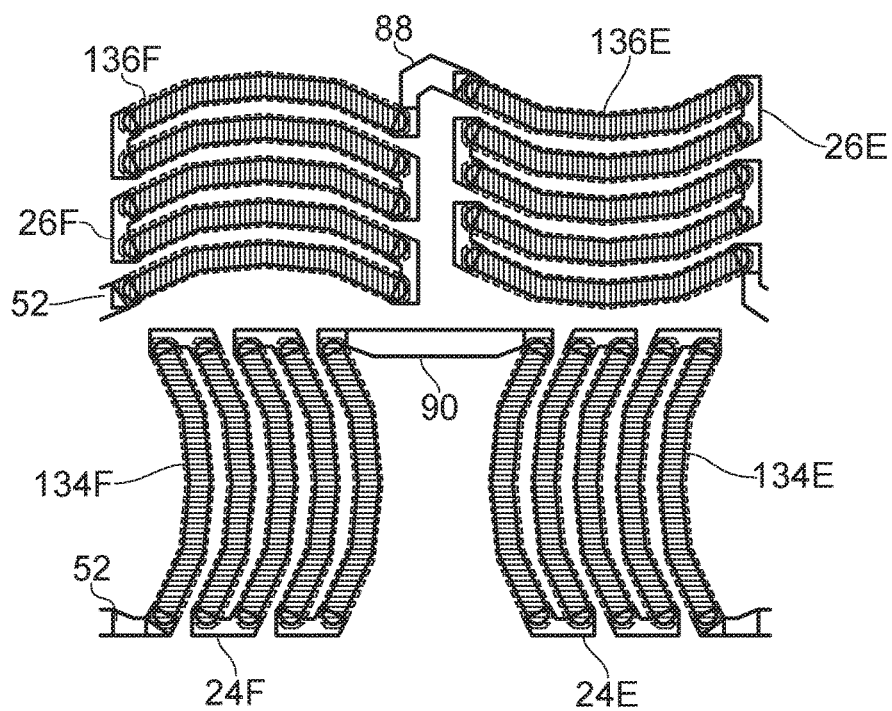
FIG. 10 is a close-up plan view of another section of the circuit of FIG. 8.

FIG. 10 shows a close-up of the area 142 from FIG. 8. FIG. 10 shows groups of elements 26F, 26E, 24F and 24E. These elements are connected to bondpad 32 via interconnector 52. The groups are coupled together via interconnectors 88 and 90. Each group of elements has a corresponding group of metallic conductors. In this example, four complete groups of metallic conductors 136F, 136E, 134F and 134E are shown.

Figure 11:
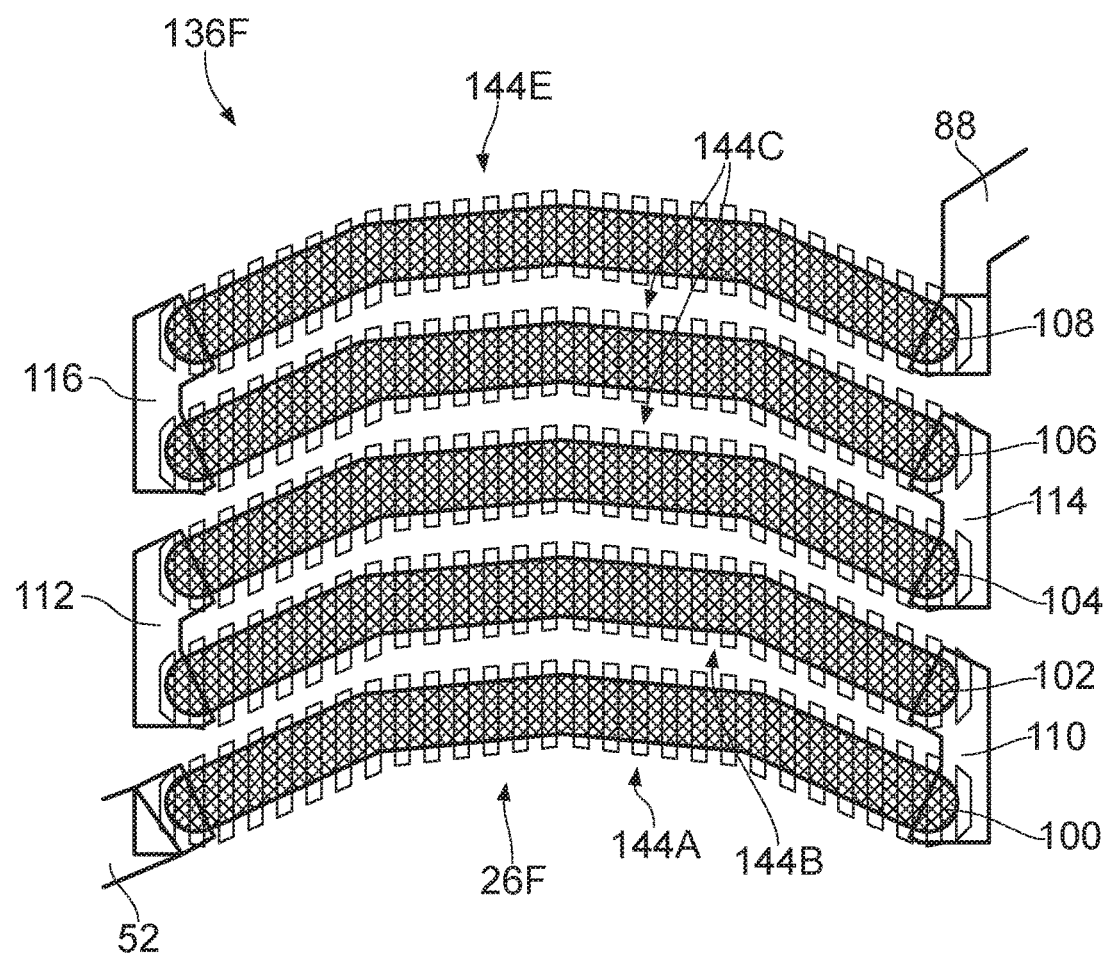
FIG. 11 is a close-up plan view of a group of thin film resistive elements of the circuit of FIG. 8.

FIG. 11 shows the detail of the group of elements 26F shown in FIG. 10. The same reference numerals as used for components that are common with FIG. 7. FIG. 11 also shows part of the stress equalization layer 60. In particular, FIG. 11 shows the group of conductors 136F. Group 136F comprises a five subgroups of linear metallic conductors. In this example, there are subgroups 144A, 144B, 144C, 144D and 144E. Each subgroup has thirty conductors. Given the relatively large number of conductors, they have not been individually numbered. The conductors may have the same width and spacing as the conductors shown in FIG. 7. They are orientated in a direction perpendicular to an imaginary line drawn between the first and second ends of the resistive elements in FIG. 11. As such, the angle at which the metallic conductors intersect the resistive elements varies, depending upon where the intersection occurs. In this example, each linear conductor only extends beneath one resistive element. Each of the metallic conductors extends beyond the edges of its respective elements by an amount which may be substantially less than the width of the elements. In a similar manner, at either end of the elements, the metallic conductors extend beyond the ends of the elements. The metallic conductors therefore define a stress equalization area that is similar in shape to the area defined by each element. However, in FIG. 11 the stress equalization area is larger as it extends beyond the elements as described above. Furthermore, the illustrated metallic elements all have a smaller width than the TF elements. In one example, the metallic elements may be between one firth and one tenth the width of the resistive elements. The spacing between the metallic elements may be similar to their widths. In one example, for TF elements that are 4 µm wide, the metallic elements may have widths of 0.4 µm and separation of 0.4 µm.

Figure 12:
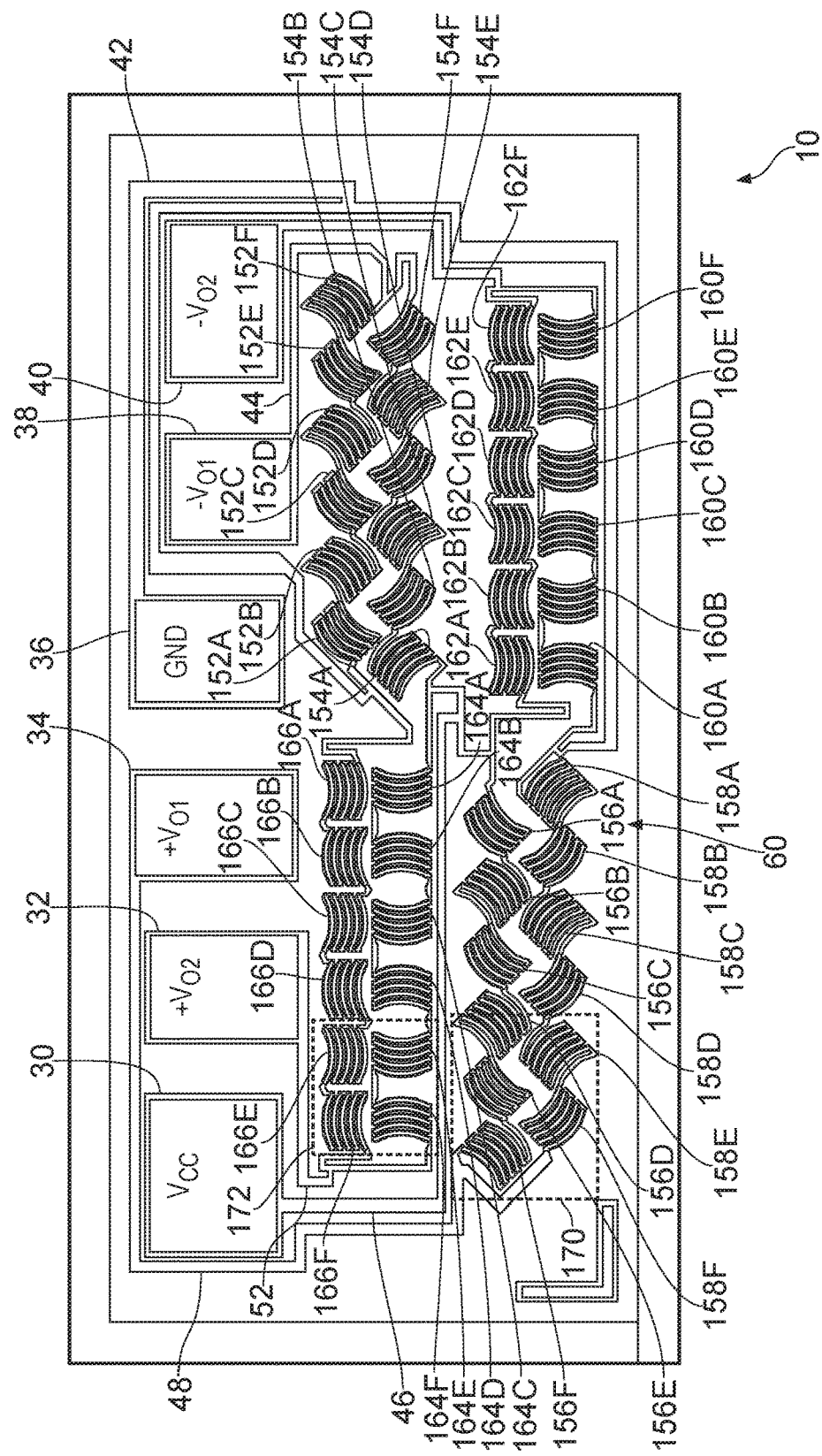
FIG. 12 is a plan view of an integrated circuit incorporating a thin film magnetoresistive sensor in accordance with a further embodiment of the disclosure.

FIG. 12 shows magnetoresistive TF sensor 10 in a further embodiment of this disclosure. In this embodiment, sensor 10 includes the same components as the previous embodiments. However, the stress equalization layer 60 takes a different form. In this embodiment, the metallic layer is formed as series of arcuate metallic conductors. There are five metallic elements, each one corresponding to a TF resistive element. Each metallic element is substantially the same shape as the corresponding resistive elements, as will be described in more detail below. The conductors are arranged into groups, with each group corresponding to a group of TF elements. The stress equalization layer 60 includes metallic conductor groups 152A to 152F, 154A to 154F, 156A to 156F, 158A to 158F, 160A to 160F, 162A to 162F, 164A to 164F and 166A to 166F. In FIG. 12, two areas 170 and 172 are outlined by broken lines. These areas are shown in more detail in FIGS. 13 and 14 respectively.

Figure 13:
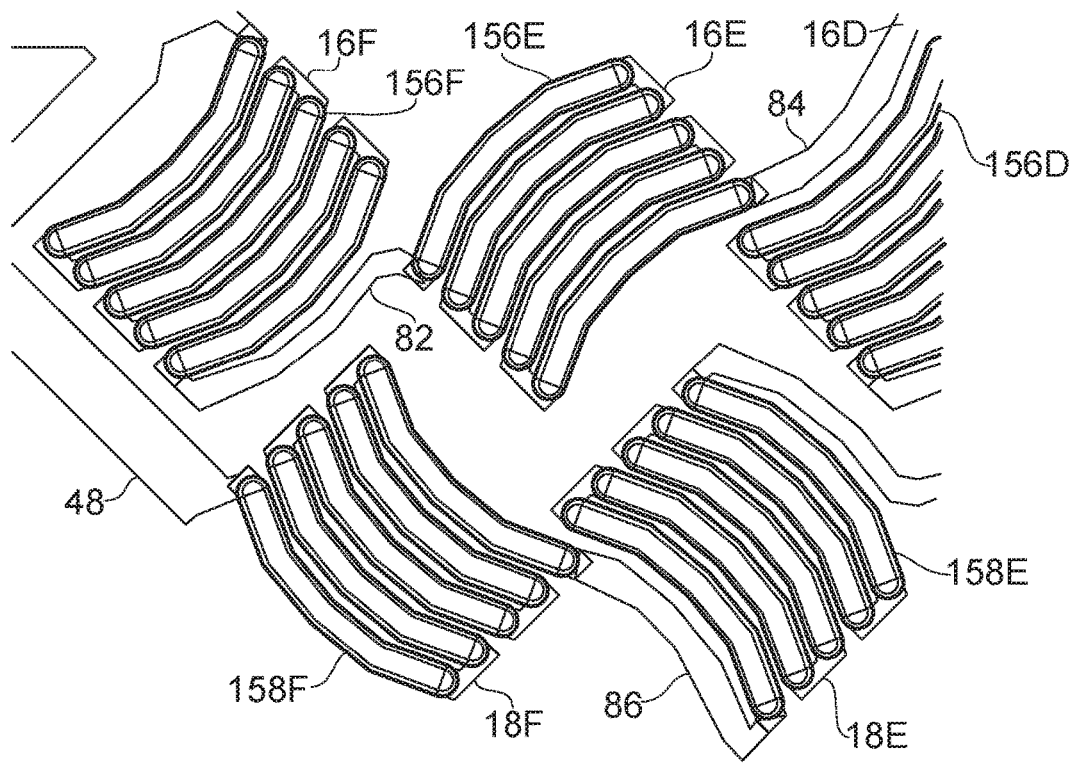
FIG. 13 is close-up plan view of a section of the circuit of FIG. 12.

FIG. 13 shows a close-up of the area 170 from FIG. 12. FIG. 13 shows groups of elements 16F, 16E, 16D, 18F and 18E. These groups are connected to bondpad 34 via TF interconnector 48. The groups are coupled together via TF interconnectors 82, 84 and 86. Each group of elements has a corresponding group of metallic conductors in the stress equalization layer 60. In this example, groups of metallic conductors 156F, 156E, 156D, 158F and 156E are shown. Further details of the metallic conductors will be described below.

Figure 14:
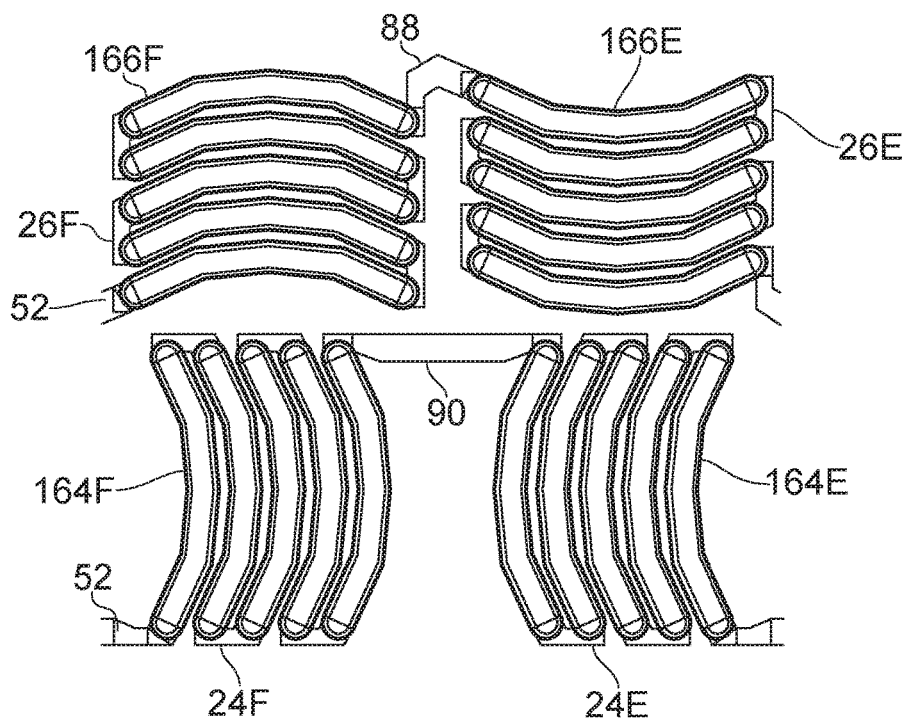
FIG. 14 is a close-up plan view of another section of the circuit of FIG. 12.

FIG. 14 shows a close-up of the area 172 from FIG. 12. FIG. 14 shows groups of elements 26F, 26E, 24F and 24E. These elements are connected to bondpad 32 via interconnector 52. The groups are coupled together via interconnectors 88 and 90. Each group of elements has a corresponding group of metallic conductors. In this example, four complete groups of metallic conductors 166F, 166E, 164F and 164E are shown.

Figure 15:
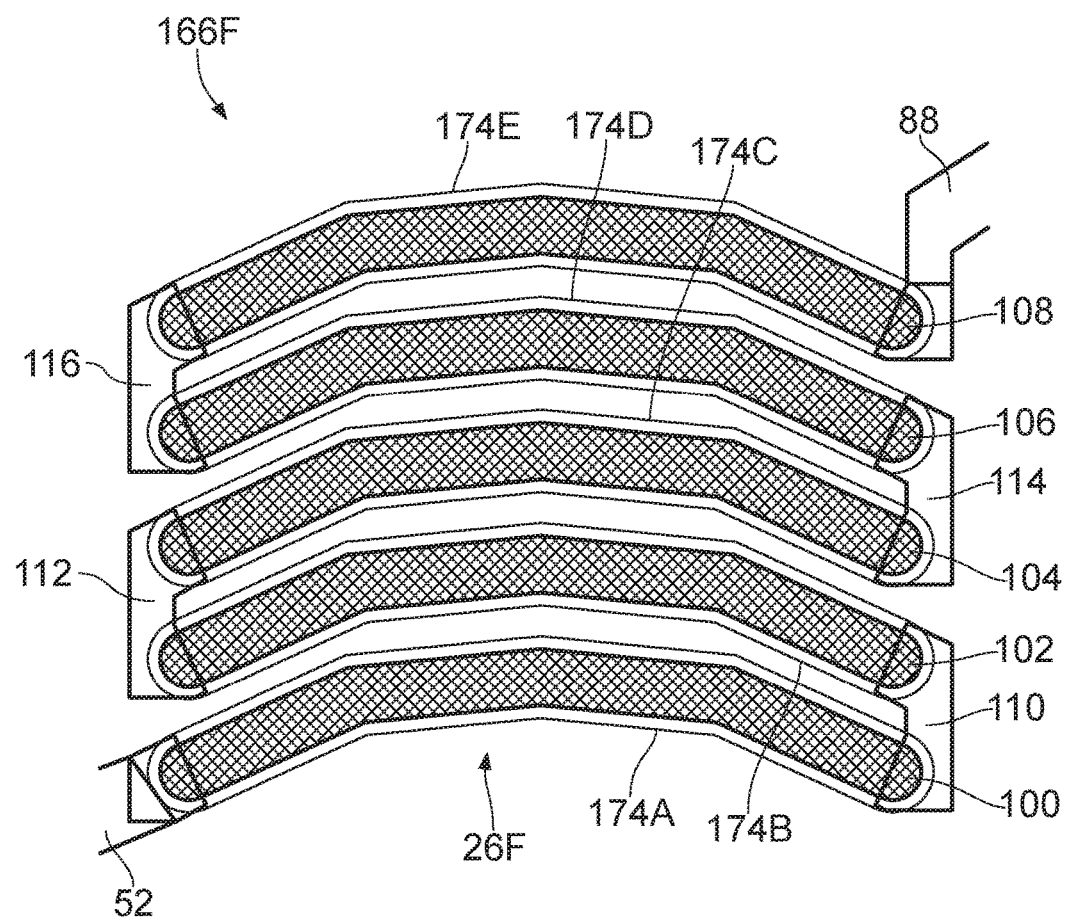
FIG. 15 is a close-up plan view of a group of thin film resistive elements of the circuit of FIG. 12.

FIG. 15 shows the detail of the group of elements 26F shown in FIG. 14. The group includes five magnetoresistive elements 100, 102, 104, 106 and 108. FIG. 15 also shows part of the stress equalization layer 60. In particular, FIG. 15 shows the group of conductors 166F. Group 166F comprises five metallic elements 174A, 174B, 174C, 174D and 174E. The metallic elements are each around 60 µm long, and 6 µm wide in one example. They are arranged in parallel, and can be approximately 2 µm apart. Each element is generally arcuate in shape. However, as with the resistive elements, they are actually formed of four short linear sections as illustrated. The metallic elements are substantially the same shape as the resistive elements. However, the illustrated metallic elements are slightly larger than the resistive elements, so that the metallic elements extend beyond the edges of the resistive elements. In this example, the metallic elements extend around 1 µm beyond the edges of the resistive elements, which is substantially less than the width of the elements. The metallic elements can be approximately 50% bigger than the resistive elements. The metallic conductors therefore define a stress equalization area that is similar in shape to the area defined by each element. However, the illustrated stress equalization area is larger as it extends beyond the elements as described above.

Figure 16:
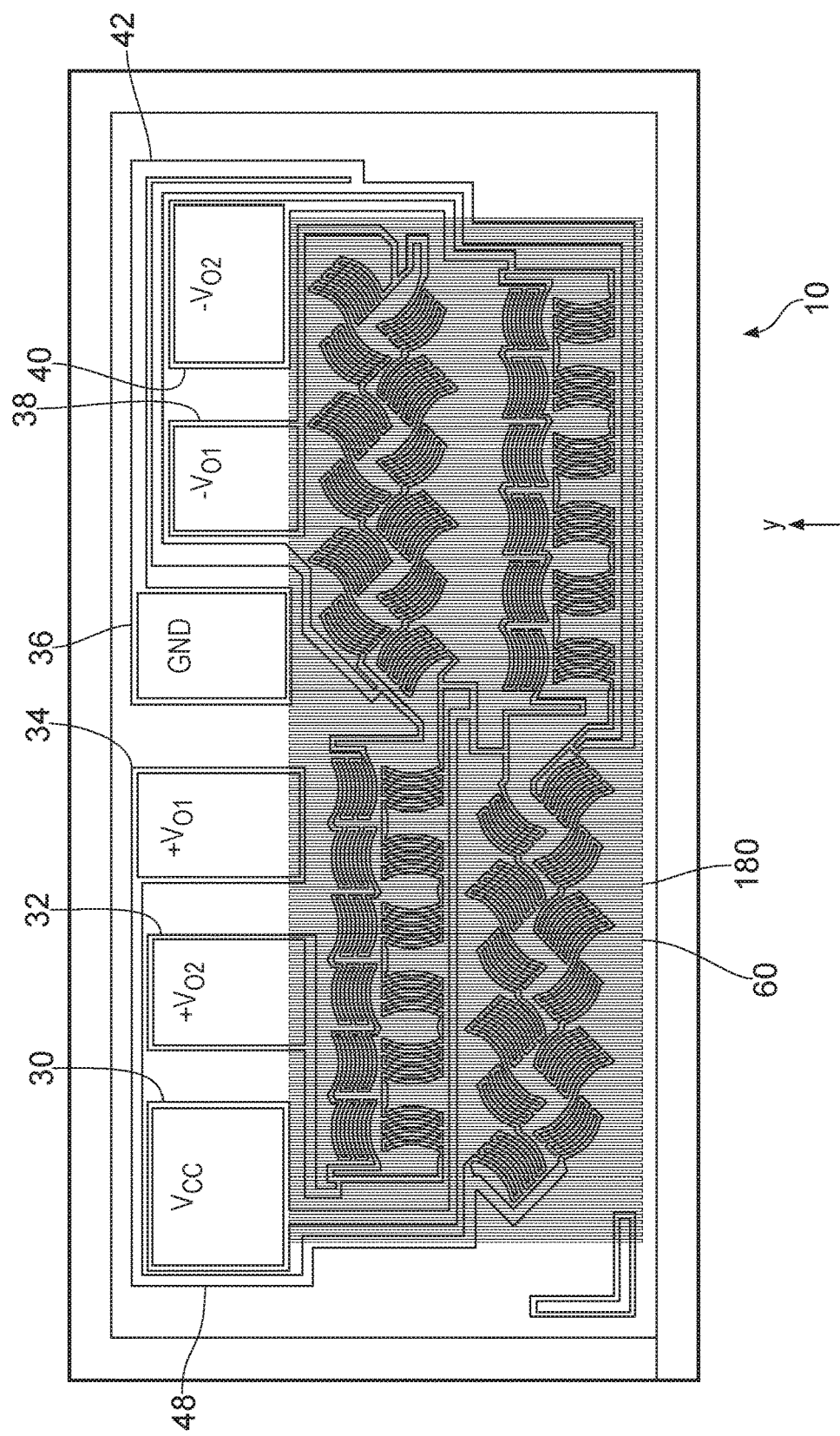
FIG. 16 is a plan view of an integrated circuit incorporating a thin film magnetoresistive sensor in accordance with a further embodiment of the disclosure.
Figure 17:
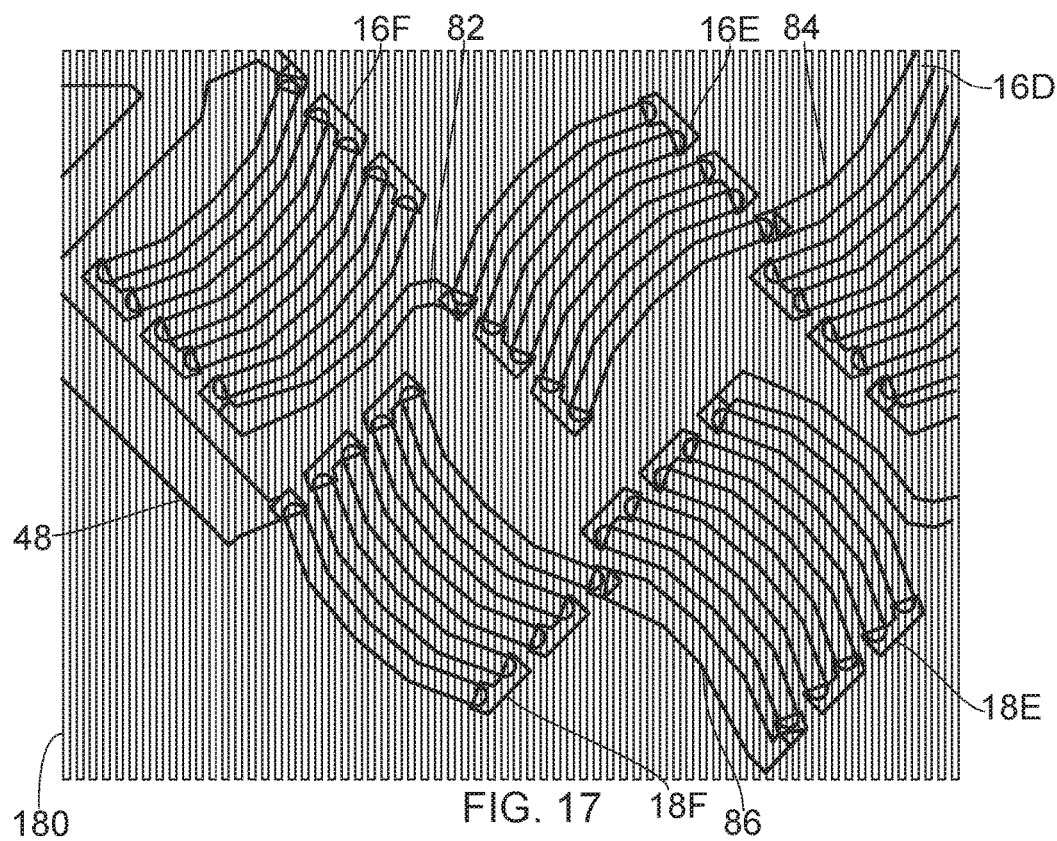
FIG. 17 is close-up plan view of a section of the circuit of FIG. 16.
Figure 18:
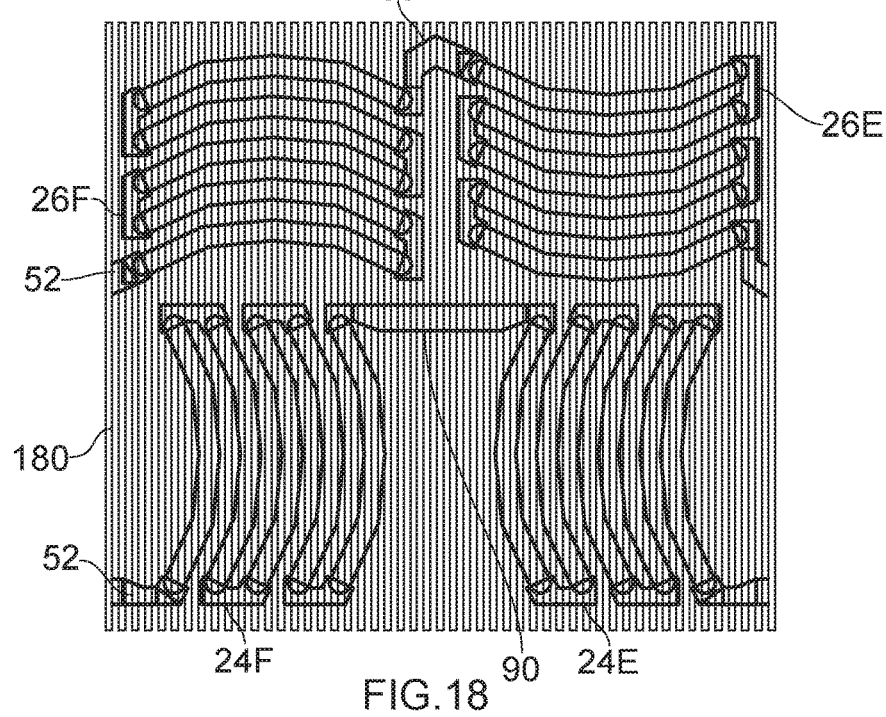
FIG. 18 is a close-up plan view of another section of the circuit of FIG. 16.

FIG. 16 shows magnetoresistive TF sensor 10 in accordance with a further embodiment of this disclosure. Sensor 10 includes the same components as shown in FIG. 12. However, the stress equalization layer 60 is different to stress equalization layer shown in FIG. 12. The metallic layer is formed as series of parallel elongate metallic elements. Rather than being restricted to the area immediately below each TF element or group of elements, the stress equalization structure 60 of FIG. 16 extends into the area in-between and around each group of TF elements. In this example, the metallic elements together form a rectangular shape 180 that is large enough to extend under all of the groups of TF elements of the TF sensor 10. In FIGS. 17 and 18 respectively, the same areas as indicated by broken lines 170 and 172 in FIG. 12 are shown in more detail.

FIG. 17 shows groups of elements 16F, 16E, 16D, 18F and 18E. These groups are connected to bondpad 34 via TF interconnector 48. The groups are coupled together via TF interconnectors 82, 84 and 86. FIG. 18 shows groups of elements 26F, 26E, 24F and 24E. These elements are connected to bondpad 32 via interconnector 52. The groups are coupled together via interconnectors 88 and 90.

Figure 19:
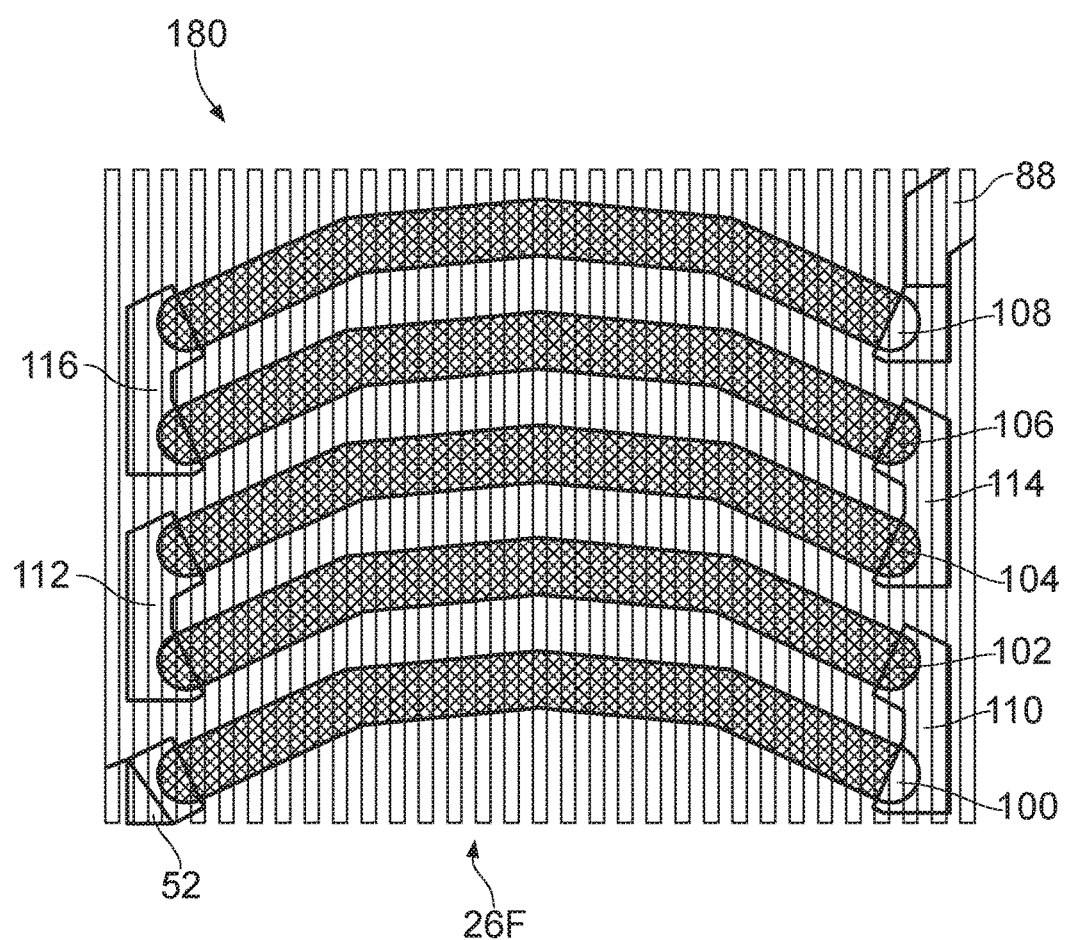
FIG. 19 is a close-up plan view of a group of thin film resistive elements of the circuit of FIG. 16.
Figure 20:
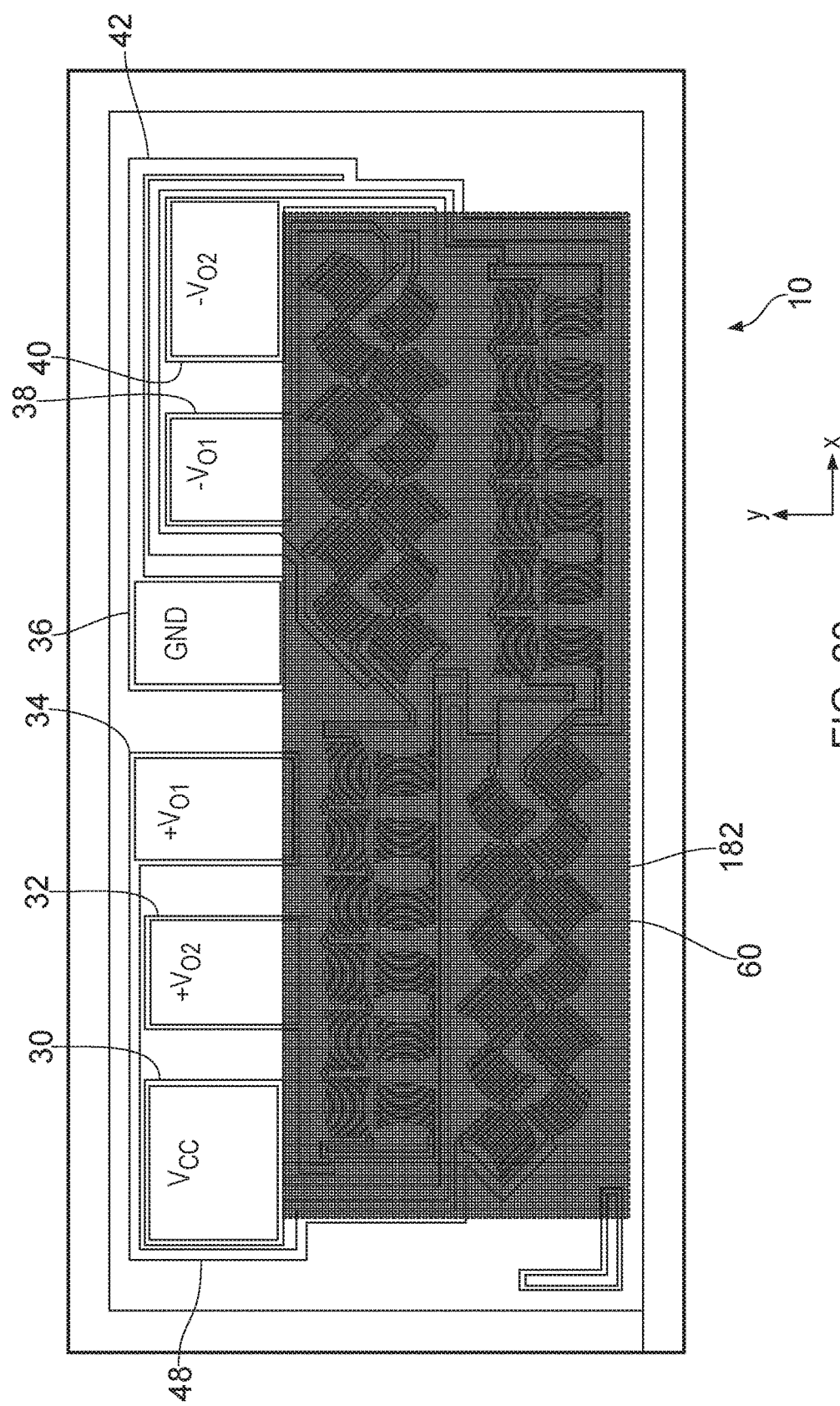
FIG. 20 is a plan view of an integrated circuit incorporating a thin film magnetoresistive sensor in accordance with a further embodiment of the disclosure.
Figure 21:
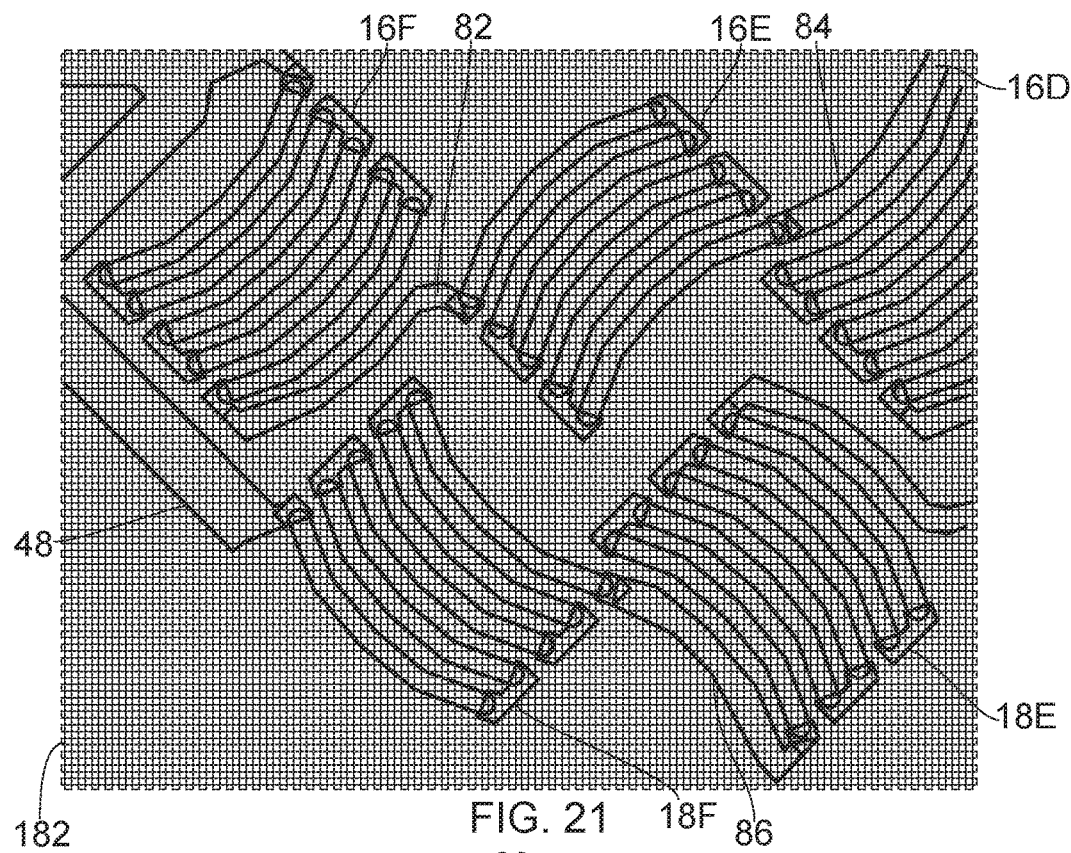
FIG. 21 is close-up plan view of a section of the circuit of FIG. 20.
Figure 22:
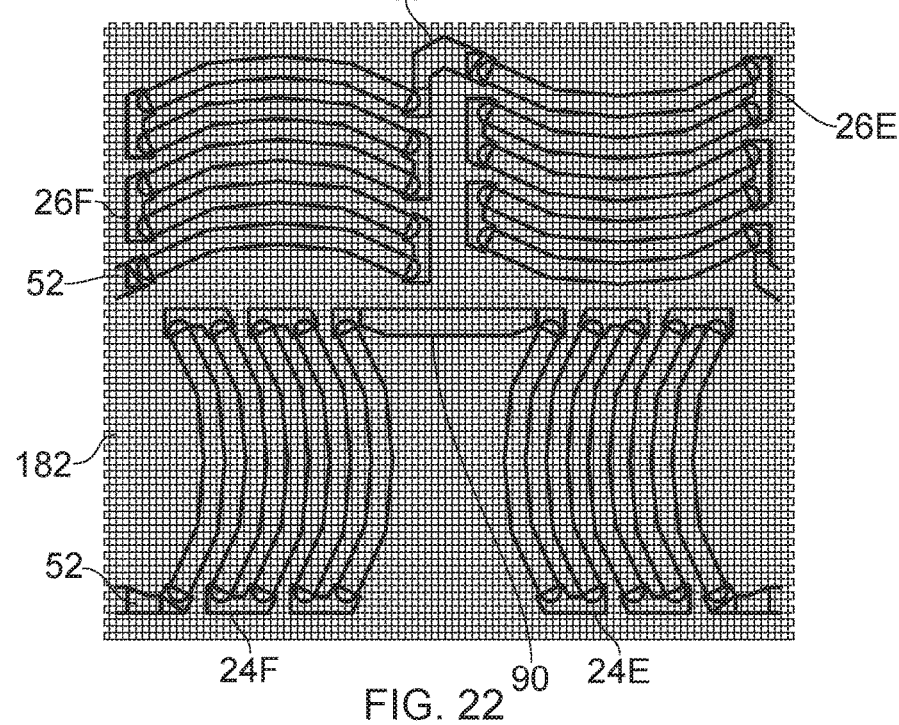
FIG. 22 is a close-up plan view of another section of the circuit of FIG. 20.
Figure 23:
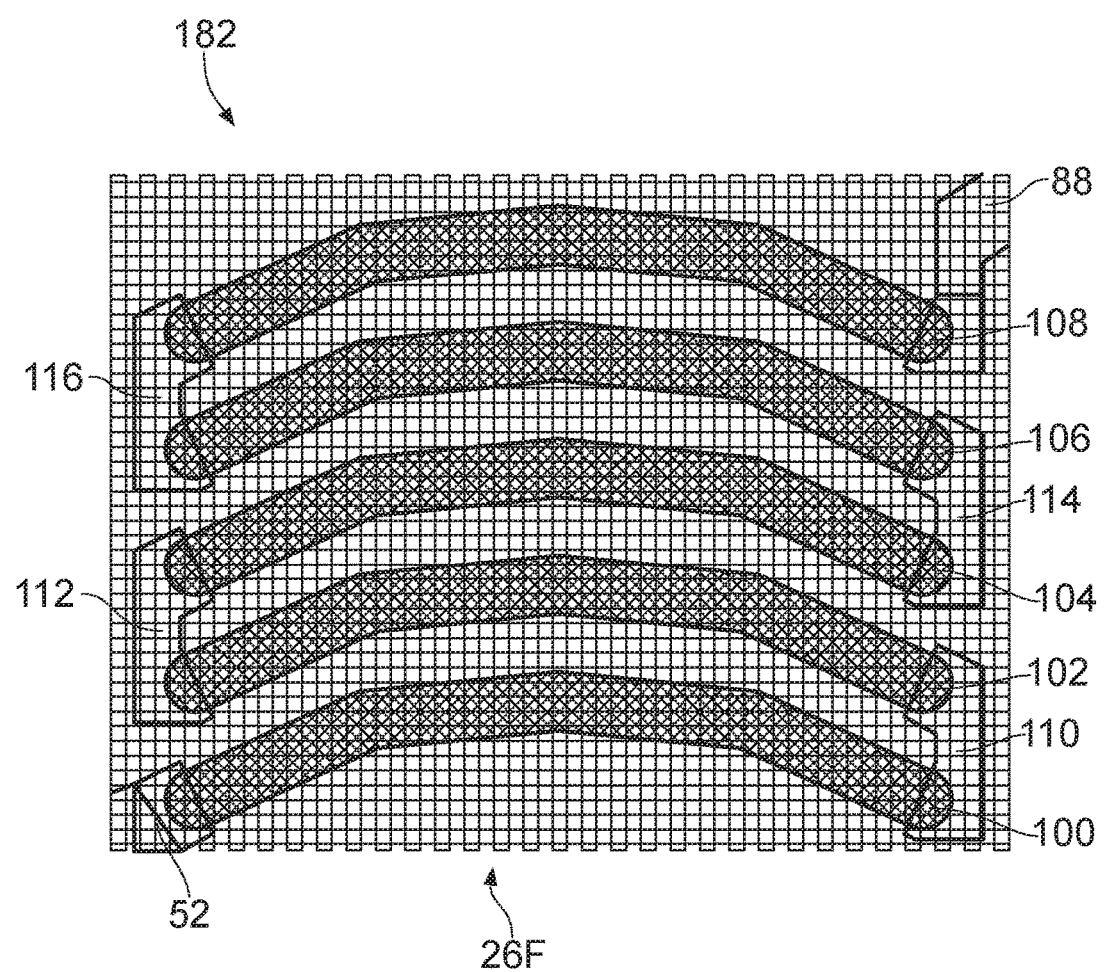
FIG. 23 is a close-up plan view of a group of thin film resistive elements of the circuit of FIG. 20.
Figure 24:
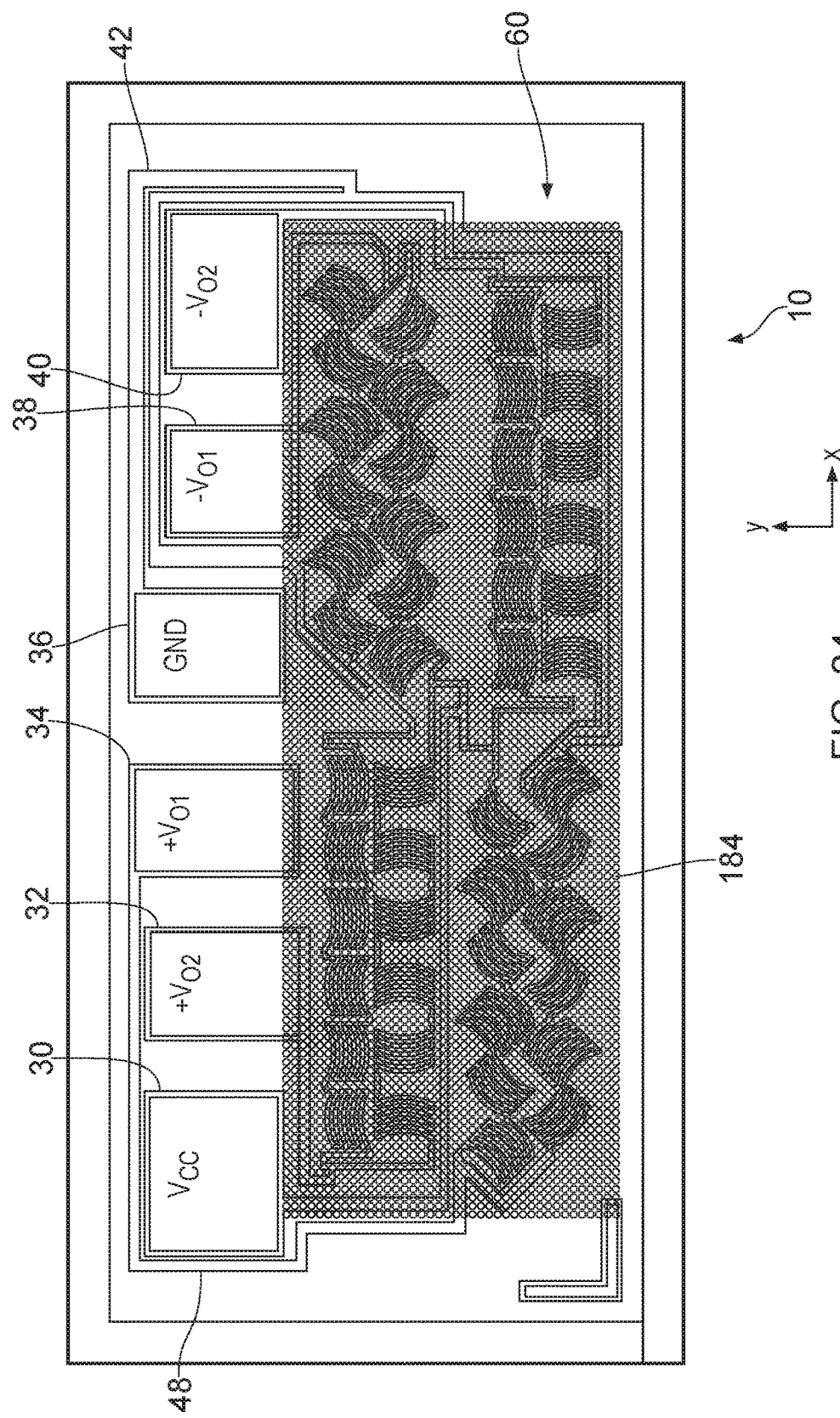
FIG. 24 is a plan view of an integrated circuit incorporating a thin film magnetoresistive sensor in accordance with a further embodiment of the disclosure.
Figure 27:
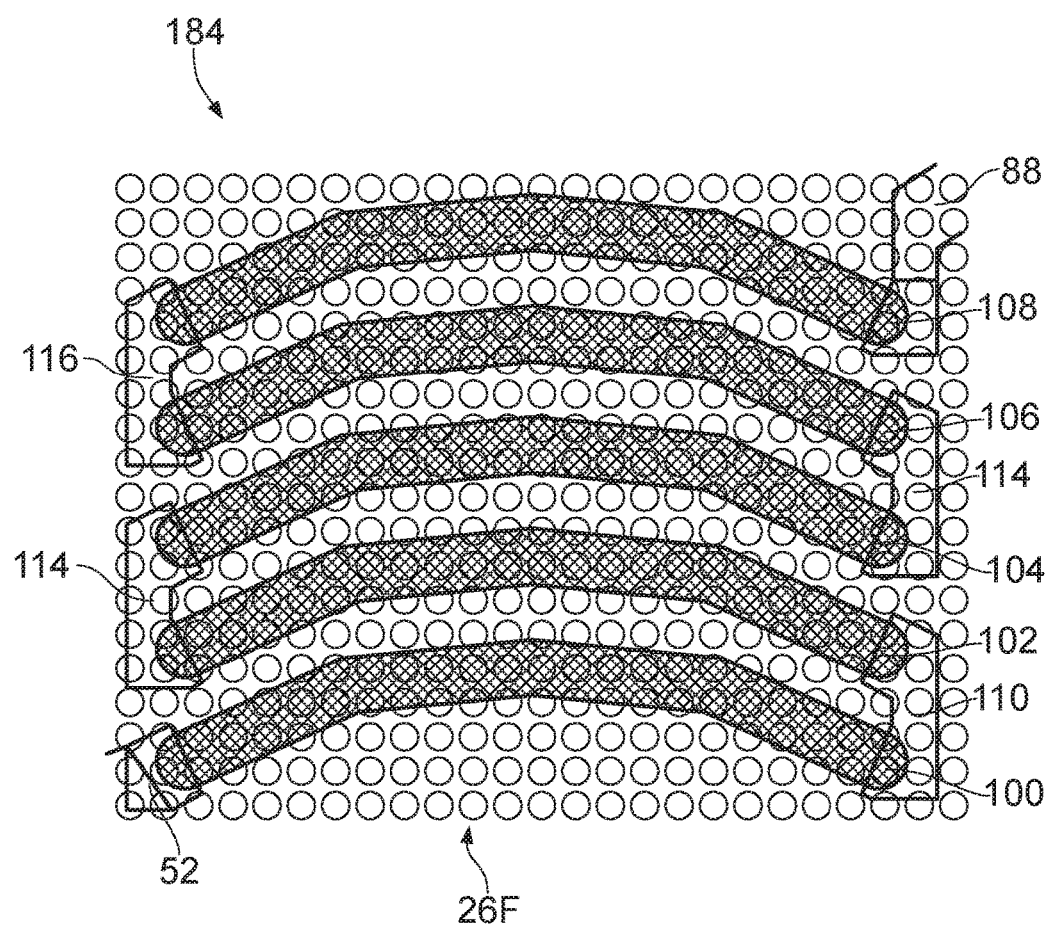
FIG. 27 is a close-up plan view of a group of thin film resistive elements of the circuit of FIG. 24.

FIG. 19 shows the detail of the group of elements 26F shown in FIG. 18. FIG. 19 also shows the conductors 180 of the stress equalization structure 60. The metallic conductors can each be around 1 µm wide. They are arranged in parallel, and can be approximately 1 µm apart. The metallic conductors therefore define a stress equalization area that extends under all of the illustrated resistive elements.

FIGS. 20 to 23 show a further example of a stress equalization layer 60, in which the conductors 182 are arranged as a mesh under all of the resistive TF elements. As illustrated, the mesh includes a first set of substantially parallel conductors and a second set of substantially parallel conductors, in which conductors of the first set are substantially orthogonal to conductors of the second set.

FIGS. 24 to 27 show a further example of a stress equalization layer 60, in which the conductors 184 are arranged as a series of circles, the circles being formed in rows and columns extending under all of the resistive TF elements.

Figure 28:
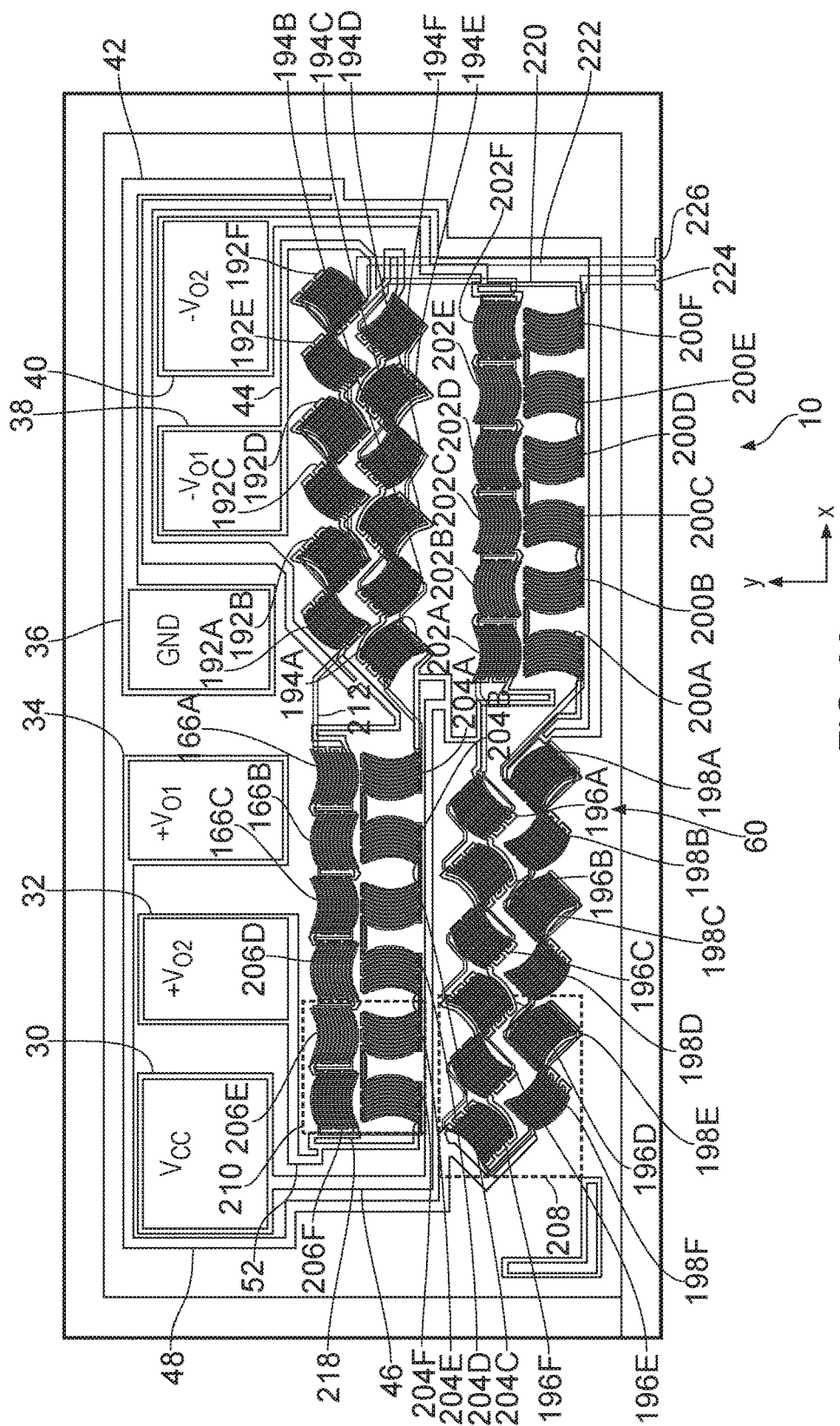
FIG. 28 is a plan view of an integrated circuit incorporating a thin film magnetoresistive sensor in accordance with a further embodiment of the disclosure.

FIG. 28 shows magnetoresistive TF sensor 10 in which the stress equalization layer 60 can also act as a heating element. The stress equalization layer 60 is similar to the stress equalization layer shown in FIGS. 4 to 7, however, there are certain differences. As will be described in more detail below, the elements of the stress equalization layer 60 are coupled together, and are also coupled to interconnectors that complete an electric circuit. As such, current may be passed through the stress equalization layer, causing the structure to heat. The structure 60 comprises a metallic layer is formed as series of linear metallic conductors, in a similar manner to that shown in FIGS. 4 to 7. The layer 60 includes groups of metallic conductors 192A to 192F, 194A, to 194F, 196A to 196F, 198A to 198F, 200A to 200F, 202A to 202F, 204A to 204F and 206A to 206F. In FIG. 28, two areas 208 and 210 are outlined by broken lines. These areas are shown in more detail in FIGS. 29 and 30 respectively. The metallic conductors are coupled together by various metallic interconnectors, for example including interconnectors 212, 214, 216, 218, 220 and 222. The interconnectors also couple the metallic conductors to connectors 224 and 226, enabling the metallic conductors to be coupled to a current source.

Figure 29:
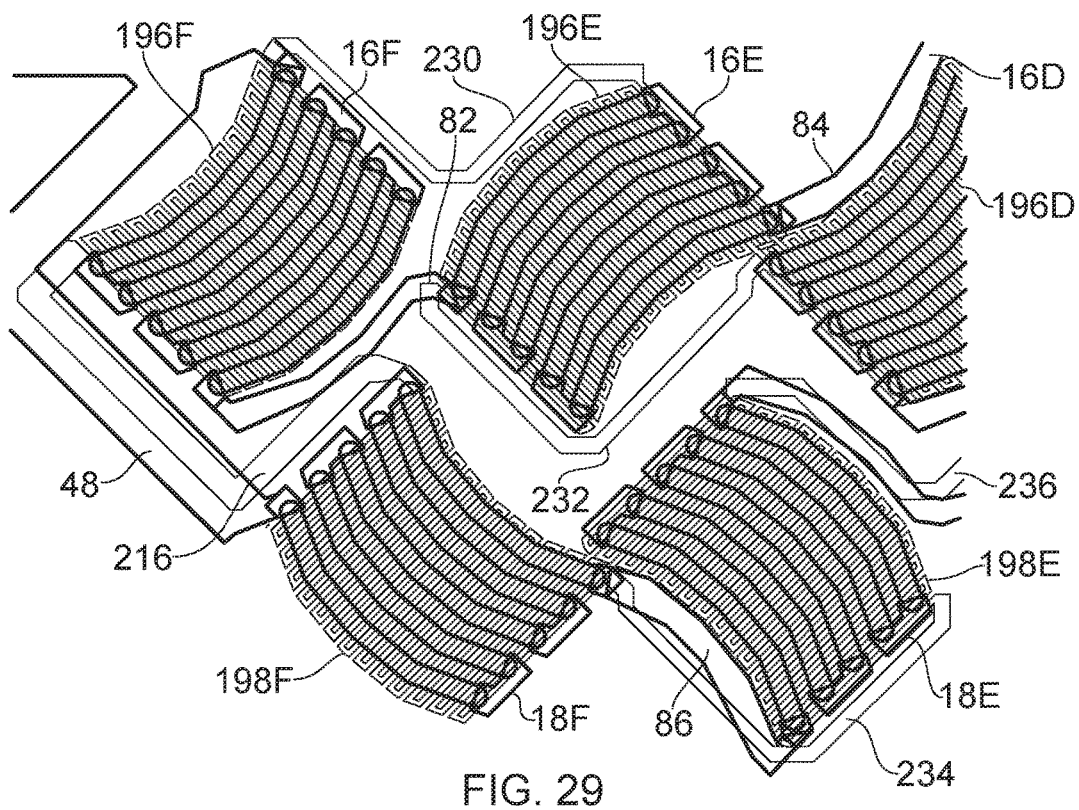
FIG. 29 is close-up plan view of a section of the circuit of FIG. 28.

FIG. 29 shows a close-up of the area 208 from FIG. 28. FIG. 29 shows groups of elements 16F, 16E, 16D, 18F and 18E. These groups are connected to bondpad 34 via TF interconnector 48. The groups are coupled together via TF interconnectors 82, 84 and 86. Each group of elements has a corresponding group of metallic conductors in the stress equalization layer. In this example, groups of metallic conductors 196F, 196E, 196D, 198F and 198E are shown. Also shown are various metallic interconnectors. Groups of conductors 198F and 196F are coupled together by interconnector 216. Groups of conductors 196F and 196E are coupled together by interconnector 230. Groups of conductors 196E and 196D are coupled together by interconnector 232. Groups of conductors 198F and 198E are coupled together by interconnector 234. Further details of the metallic conductors will be described below.

Figure 30:
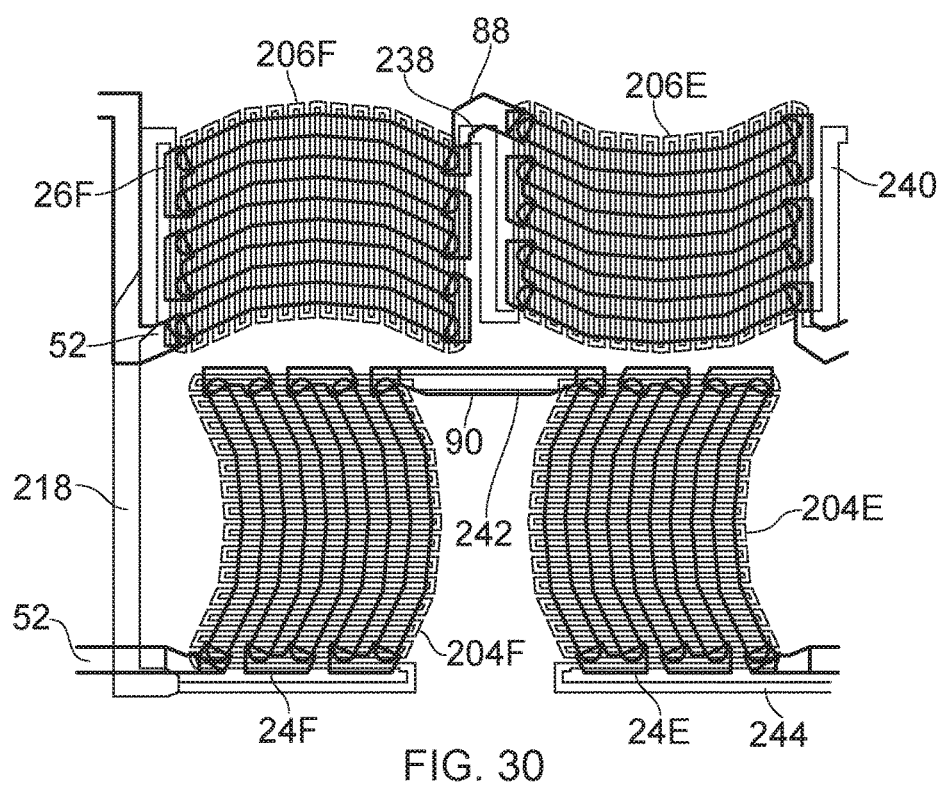
FIG. 30 is a close-up plan view of another section of the circuit of FIG. 28.

FIG. 30 shows a close-up of the area 210 from FIG. 28. FIG. 30 shows groups of elements 26F, 26E, 24F and 24E. These groups of elements are connected to bondpad 32 via interconnector 52. The groups are coupled together via interconnectors 88 and 90. Each group of elements has a corresponding group of metallic conductors in the stress equalization layer. In this example, four complete groups of metallic conductors 206F, 206E, 204F and 204E are shown. Also shown are various metallic interconnectors. Groups of conductors 206F and 204F are coupled together by interconnector 218. Groups of conductors 206F and 206E are coupled together by interconnector 238. Groups of conductors 204F and 204E are coupled together by interconnector 242.

Figure 31:
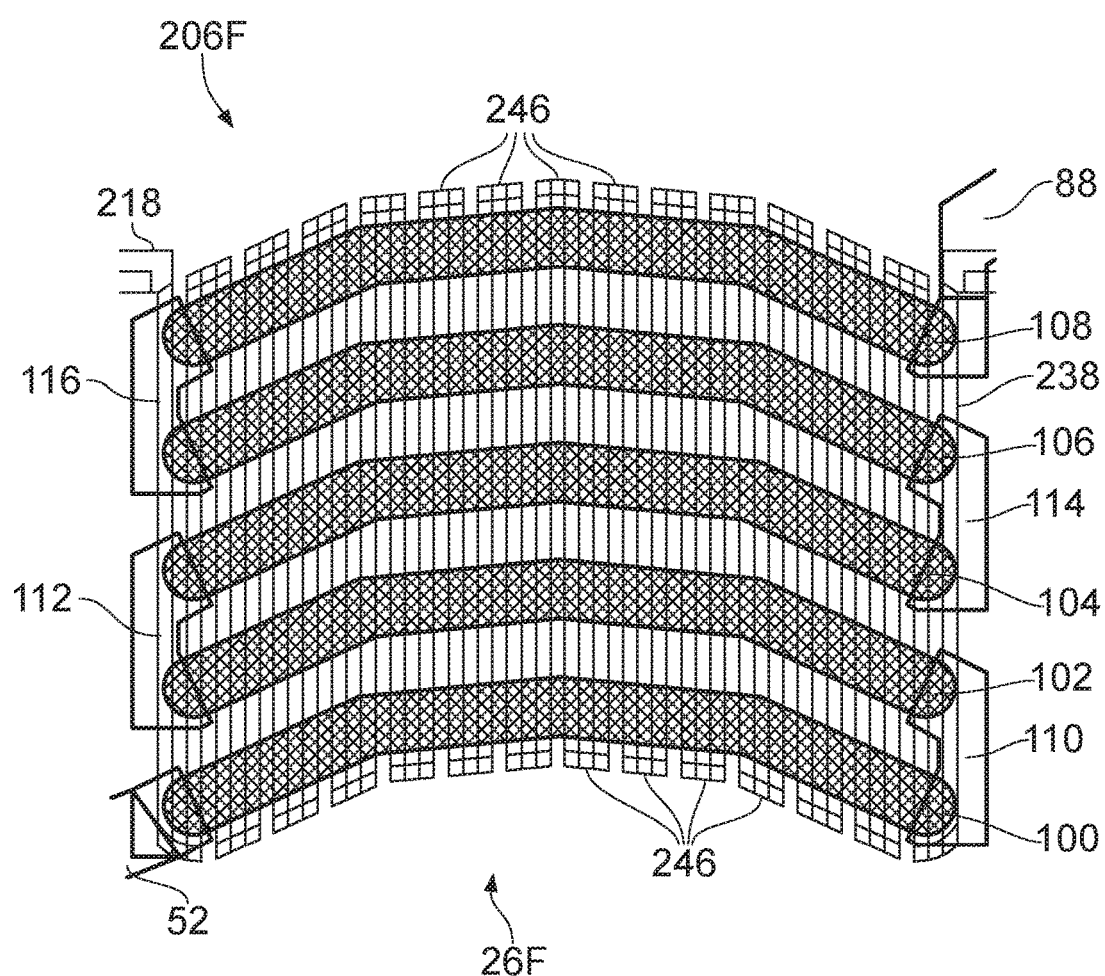
FIG. 31 is a close-up plan view of a group of thin film resistive elements of the circuit of FIG. 28.

FIG. 31 shows a closer view of the group of elements 26F shown in FIG. 30. The arrangement shown in FIG. 31 is similar to that shown in FIG. 7, and corresponding reference numerals have been used. FIG. 31 also shows part of the stress equalization layer 60. In particular, FIG. 31 shows the group of conductors 206F. Group 206F comprises a plurality of linear metallic conductors. In this example, there are thirty conductors. Given the relatively large number of conductors, they have not been individually numbered. The conductors can each be around 45 μm long, and 1 μm wide. They are arranged in parallel, and can be approximately 1 μm apart. They are orientated in a direction perpendicular to an imaginary line drawn between the first and second ends of the resistive elements in FIG. 31. As such, the angle at which the metallic conductors intersect the resistive elements varies, depending upon where the intersection occurs. Each of the metallic lines extend beyond the edges of outer elements 100 and 108 by a distance similar to the width of the elements. In a similar manner, at either end of the elements, the metallic conductors extend beyond the ends of the elements in FIG. 31, for example, by a distance of around 2 μm. The metallic conductors therefore define a stress equalization area that is similar in shape to the area defined by the elements. However, the illustrated stress equalization area is larger as it extends beyond the elements as described above. Furthermore, the metallic elements all have a lesser width than the TF elements. In one example, the metallic elements may be between one firth and one tenth the width of the resistive elements. The spacing between the metallic elements may be similar to their widths. In one example, for TF elements that are 4 μm wide, the metallic elements may have widths of 0.4 μm and separation of 0.4 μm.

As illustrated in FIG. 31, each metallic conductor is coupled to one adjacent conductor at one end, and another adjacent conductor at the opposing end. The metallic conductors formed at the edge of the group of conductors are coupled to interconnectors that connect the conductors to other groups of conductors. As such, a meandering electrical path is formed along the metallic conductors. In use, a current is passed through the conductors. This can cause the conductors to reach a predetermined temperature above ambient temperature relatively rapidly. Advantageously the predetermined temperature may be approximately 100° C. Furthermore this arrangement can be used with an on-chip temperature sensor in a closed control loop to keep thin film resistors at a substantially constant predetermined temperature. When such sensor is calibrated at this given temperature, temperature drift of sensitivity or temperature drift of offset can be essentially removed or minimized, resulting in improved sensor output stability over ambient temperature.

An advantage of this arrangement is that the entire sensor can be heated to approximately the same temperature. If different parts of the sensor are at different temperature, a mismatch may occur between different resistive elements. By keeping the sensor at the same temperature, the components can be better matched, and a more accurate sensor can result.

One example of manufacturing a TF sensor 10 will now be discussed. The sensor is manufactured by first providing a substrate. An integrated circuit including a first component is provided over the substrate. The first component may be any other component suitable for integration on the same die as a thin film resistive sensor (e.g., an amplifier, analog-to-digital converter, etc . . . ). The structure of this component comprises metallic traces that underlie the sensor. An isolation layer is formed over the first component. The metallic layer is then formed over the isolation layer. The metallic layer is then etched to produce the stress equalization structure. A second isolation layer is provided over the stress equalization structure and is planarized by CMP (chemical-mechanical polishing) to form a planar surface for the sensor. A resistive layer is then deposited over the second isolation layer. This is etched to produce the resistive thin film sensor. The interconnectors are then formed from another metallization, for example, gold. A passivation layer is then used to protect the structure from environmental influences and openings in the passivation layer produce the bondpads.

A stress equalization layer is one that reduces the effects of stress caused by underlying or overlying elements. In this respect, while an aim of a stress equalization layer is to equalize the impact of stress in an absolute sense, it will be appreciated that in practice complete equalization may not be possible, and that the stress equalization layer typically reduces the impact of stress. While certain stress equalization structures have been described, any suitable arrangement of conductors or other stress equalization elements can be implemented in the stress equalization layer to thereby provide stress equalization for thin film elements in an adjacent layer. Moreover, although embodiments may discuss stress equalization layers disposed below thin film elements, any of the principles and advantages discussed herein can be applied to a stress equalization layer above thin film elements, to stress equalization layers both layers above and below thin film elements, to more than one stress equalization layer below thin film elements, and/or to more than one stress equalization layer below thin film elements. The stress equalization layers discussed herein can be implemented in connection with any thin film elements that could benefit from stress equalization.

Although the claims presented here are in single dependency format for filing at the USPTO, it is to be understood that any claim may depend on any preceding claim of the same type except when that is clearly not technically feasible.

Aspects of this disclosure can be implemented in various electronic devices. Examples of the electronic devices can include, but are not limited to, consumer electronic products, parts of the electronic products such as packaged electronic components, electronic test equipment, cellular communications infrastructure, etc. Examples of the electronic devices can include, but are not limited to, precision instruments, medical devices, wireless devices, a mobile phone such as a smart phone, a telephone, a television, a computer monitor, a computer, a modem, a hand-held computer, a laptop computer, a tablet computer, a wearable computing device such as a smart watch, a personal digital assistant (PDA), a vehicular electronics system such as an automotive electronics system, a microwave, a refrigerator, a vehicular electronics system such as automotive electronics system, a stereo system, a DVD player, a CD player, a digital music player such as an MP3 player, a radio, a camcorder, a camera, a digital camera, a portable memory chip, a washer, a dryer, a washer/dryer, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number, respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while elements and assemblies are presented in a given arrangement, alternative embodiments may perform similar functionalities with different components and/or circuit topologies, and some elements may be deleted, moved, added, subdivided, combined, and/or modified. Each of these elements or assemblies may be implemented in a variety of different ways. Any suitable combination of the elements, assemblies, and/or acts of the various embodiments described above can be combined to provide further embodiments. The accompanying claims and their equivalents are intended to cover such forms or modifications as would fall within the scope and spirit of the disclosure.

What is claimed is:

1. A thin film magnetoresistive device with stress equalization for use in an integrated circuit, the thin film magnetoresistive device comprising:
   thin film magnetoresistive elements formed in a first layer of the thin film magnetoresistive device so as to form a sensor; and
   a stress equalization structure comprising stress equalization elements formed in a second layer of the thin film magnetoresistive device, the stress equalization elements arranged so as to equalize stress imposed on the thin film magnetoresistive elements.

2. A thin film magnetoresistive device according to claim 1, wherein the stress equalization elements are arranged in a periodic arrangement.

3. A thin film magnetoresistive device according to claim 1, wherein the stress equalization elements are elongate and arranged in parallel with each other.

4. A thin film magnetoresistive device according to claim 1, wherein each thin film magnetoresistive element has a corresponding stress equalization element of substantially similar shape and aligned therewith.

5. A thin film magnetoresistive device according to claim 4, wherein the thin film magnetoresistive elements and the stress equalization elements are arcuate.

6. A thin film magnetoresistive device according to claim 1, wherein the thin film magnetoresistive elements and the stress equalization elements are arranged in groups, and the thin film magnetoresistive element groups are aligned with respective stress equalization element groups.

7. A thin film magnetoresistive device according to claim 1, further comprising interconnectors, wherein the stress equalization elements are coupled together by the interconnectors so as to form one or more electrical paths.

8. A thin film magnetoresistive device according to claim 7, wherein the stress equalization elements are arranged to heat the device by passing current through the one or more electrical paths.

9. A thin film magnetoresistive device according to claim 1, wherein the stress equalization structure further includes a third layer of the thin film magnetoresistive device including additional stress equalization elements.

10. A thin film magnetoresistive device according to claim 1, further comprising conductive interconnectors arranged to couple the thin magnetoresistive elements together and an isolation layer disposed between the first and second layers.

11. A monolithic integrated circuit with stress equalization, the monolithic integrated circuit comprising:
    magnetoresistive thin film elements arranged as a sensor in a first layer of the monolithic integrated circuit; and
    metallic elements in a second layer of the monolithic integrated circuit, the second layer being adjacent to the first layer, and the metallic elements being disposed in positions of the second layer that correspond to positions of each of the magnetoresistive thin film elements in the first layer.

12. The monolithic integrated circuit of claim 11, wherein the metallic elements cover an area of the second layer that is similar to an area of the first layer covered by the magnetoresistive thin film elements.

13. The monolithic integrated circuit of claim 11, wherein the sensor is a magnetoresistive sensor sensitive to changes in an external magnetic field.

14. The monolithic integrated circuit of claim 11, wherein the metallic elements are configured to pass current to heat the magnetoresistive thin film elements to approximately the same temperature.

15. The monolithic integrated circuit of claim 11, wherein the magnetoresistive thin film elements comprise a group of magnetoresistive thin film elements in the first layer, and wherein the metallic elements comprise a group of metallic elements in the second layer each of which extends across the group of the magnetoresistive thin film elements in the first layer.

16. The monolithic integrated circuit of claim 11, wherein the magnetoresistive thin film elements comprise a group of parallel elongate magnetoresistive elements having lengths aligned along a first direction, wherein the metallic elements comprise a group of parallel elongate metallic elements having lengths aligned along a second direction, and wherein the first direction is substantially perpendicular to the second direction.

17. A thin film resistive device with stress equalization, the thin film resistive device comprising:

a plurality of thin film magnetoresistive elements arranged as a magnetoresistive sensor; and means for reducing a difference in stress imposed on different thin film magnetoresistive elements of the magnetoresistive sensor, wherein the means for reducing are arranged such that each of the thin film magnetoresistive elements is exposed to substantially the same stress.

18. The thin film resistive device of claim 17, wherein the means for reducing is included in a patterned metal layer, and wherein only an isolation layer is disposed between the patterned metal layer and a layer that includes the plurality of thin film magnetoresistive elements.

19. The thin film resistive device of claim 17, wherein the thin film magnetoresistive elements are arranged such that the magnetoresistive sensor is sensitive to changes in direction of an external magnetic field applied to the magnetoresistive sensor.

20. The thin film resistive device of claim 17, wherein the thin film magnetoresistive elements are arranged as at least one bridge circuit.

* * * * *